(12) United States Patent
Shono et al.

(10) Patent No.: US 8,825,452 B2
(45) Date of Patent: Sep. 2, 2014

(54) MODEL PRODUCING APPARATUS, MODEL PRODUCING METHOD, AND COMPUTER-READABLE RECORDING MEDIUM IN WHICH MODEL PRODUCING PROGRAM IS STORED

(75) Inventors: Kazuhiro Shono, Kyoto (JP); Toyoo Iida, Nagaokakyo (JP); Kengo Ichimura, Toyonaka (JP); Reiji Takahashi, Kyoto (JP); Akira Ishida, Nagoya (JP); Yasuyuki Ikeda, Kyoto (JP)

(73) Assignee: OMRON Corporation, Kyoto (JP)

( * ) Notice: Subject to any disclaimer, the term of this patent is extended or adjusted under 35 U.S.C. 154(b) by 221 days.

(21) Appl. No.: 13/030,512

(22) Filed: Feb. 18, 2011

(65) Prior Publication Data

US 2011/0218776 A1  Sep. 8, 2011

(30) Foreign Application Priority Data

Mar. 5, 2010  (JP) ................................ 2010-049256

(51) Int. Cl.
  *G06F 17/50* (2006.01)
(52) U.S. Cl.
  CPC ............ *G06F 17/50* (2013.01); *G06F 17/5018* (2013.01)
  USPC .................................................. 703/1; 703/2
(58) Field of Classification Search
  USPC .......................................... 703/1–2; 349/419
  See application file for complete search history.

(56) References Cited

U.S. PATENT DOCUMENTS 6,166,719 A * 12/2000 Cariffe ........................... 345/690
6,879,324 B1 * 4/2005 Hoppe ............................ 345/423

(Continued)

FOREIGN PATENT DOCUMENTS

JP      09128563 A   5/1997
JP   2000-099760 A   4/2000

(Continued)

OTHER PUBLICATIONS

"Stereo Correspondence Using Segment Connectivity," Yoshihiro Kawai, Toshio Ueshiba, Yutaka Ishiyama, Yasushi Sumi, and Fumiaki Tomita, Information Processing Society of Japan, vol. 40, No. 8, pp. 3219-3229, Aug. 1999.*

(Continued)

*Primary Examiner* — Matt Kim
*Assistant Examiner* — Maryam Ipakchi
(74) *Attorney, Agent, or Firm* — Osha Liang LLP

(57) ABSTRACT

A three-dimensional model data producing processing apparatus produces three-dimensional model data using design data (CAD data) of an object to be recognized. The three-dimensional model data producing processing includes processing conversion processing, edit processing, and teaching processing. The conversion processing and the edit processing are performed to the design data on a computer. The teaching processing is performed in a practical environment. It is not necessary to image a workpiece model in the three-dimensional model data producing processing.

12 Claims, 22 Drawing Sheets

(56) References Cited

U.S. PATENT DOCUMENTS

| | | | |
|---|---|---|---|
| 6,980,690 | B1* | 12/2005 | Taylor et al. ............ 382/154 |
| 7,023,432 | B2* | 4/2006 | Fletcher et al. ............ 345/419 |
| 7,027,963 | B2* | 4/2006 | Watanabe et al. ............ 703/1 |
| 8,004,517 | B1* | 8/2011 | Edelsbrunner et al. ....... 345/419 |
| 2001/0047251 | A1* | 11/2001 | Kemp ............ 703/1 |
| 2005/0034084 | A1* | 2/2005 | Ohtsuki et al. ............ 715/864 |
| 2007/0091119 | A1* | 4/2007 | Jezyk et al. ............ 345/619 |
| 2009/0271156 | A1* | 10/2009 | Kageura ............ 703/1 |
| 2010/0042241 | A1* | 2/2010 | Inoue ............ 700/97 |
| 2010/0042377 | A1* | 2/2010 | Seroussi et al. ............ 703/1 |
| 2010/0111364 | A1* | 5/2010 | Iida et al. ............ 382/103 |
| 2010/0156896 | A1* | 6/2010 | Ichimura et al. ............ 345/419 |
| 2011/0235897 | A1* | 9/2011 | Watanabe et al. ............ 382/154 |
| 2012/0136860 | A1* | 5/2012 | Regli et al. ............ 707/737 |
| 2012/0278049 | A1* | 11/2012 | Takashima ............ 703/1 |

FOREIGN PATENT DOCUMENTS

| | | | |
|---|---|---|---|
| JP | 2001273523 | A | 10/2001 |
| JP | 2002215696 | A | 8/2002 |
| JP | 2005056083 | A | 3/2005 |
| JP | 2006113802 | A | 4/2006 |

OTHER PUBLICATIONS

"3D Object Recognition in Cluttered Environments by Segment-Based Stereo Vision," Yasushi Sumi, Yoshihiro Kawai, Takashi Yoshimi and Fumiaki Tomita, Intelligent Systems Institue, Nat'l Institute of Aist, Int'l Journal of Computer Vision 46(1), 5-23, (2002).*

"Recognition of 3D Free-Form Objects Using Segment-Based Stereo Vision," Y. SUmi, Y., Kawai, T. Yoshimi, F. Tomita, Computer Vision, 1998. Sixth International Conference on , vol., no., pp. 668-674, 4-7 Jan 1998.*

"Sharpen & Bend: Recovering Curved Sharp Edges in Triangle MEshes Produced by Feature-Intensive Sampling," Marco Attene, Bianca Falcidieno, Jarek Rossignac, and Michela Spagnuolo, IEEE Transaction on Visualization and Computer Graphics, vol. 11, No. 2 (Mar./Apr. 2005).*

Yoshihiro Kawai, et al., Stereo Correspondence Using Segment Connectivity, Transaction of Information Processing Society of Japan, Aug. 1999, vol. 40, No. 8, pp. 3219-3229.

Concise Explanation of Cited References as Prepared by Applicant, Prior Art Documents cited in Office Action Issued in Corresponding Japanese Application No. 2010-049256, Dated May 7, 2013 (1 Page).

* cited by examiner

FIG. 10A
252a (A) TRIANGULAR PATCH DEFINITION

- TRIANGULAR PATCH 1

(COORDINATE 1a, COORDINATE 1b, COORDINATE 1c)

- TRIANGULAR PATCH 2

(COORDINATE 2a, COORDINATE 2b, COORDINATE 2c)

.
    .
    .

- TRIANGULAR PATCH N (COORDINATE Na, COORDINATE Nb, COORDINATE Nc)

FIG. 10B (B) PLANE DEFINITION

- PLANE 1 (TRIANGULAR PATCH 1,

TRIANGULAR PATCH 2, ...; NORMAL VECTOR 1)

- PLANE 2 (TRIANGULAR PATCH 3,

TRIANGULAR PATCH 4, ...; NORMAL VECTOR 2)

.
    .
    .

- PLANE M (TRIANGULAR PATCH 10,

TRIANGULAR PATCH 11, ...; NORMAL VECTOR M)

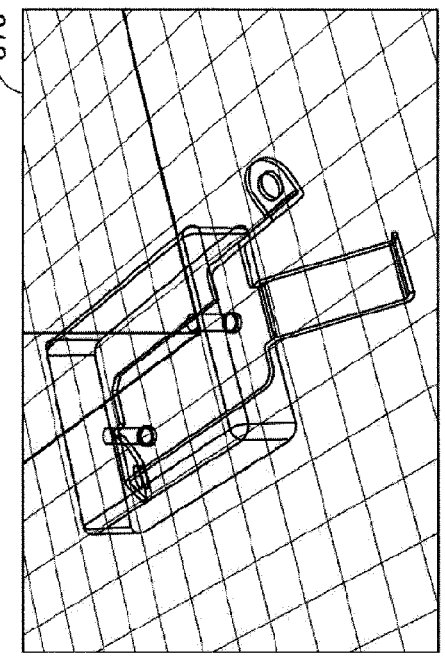
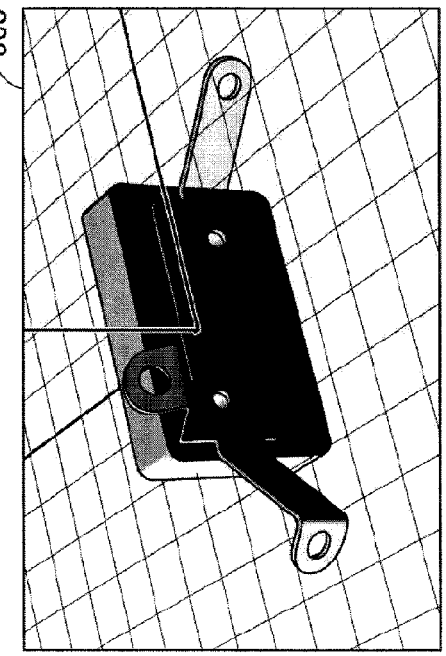
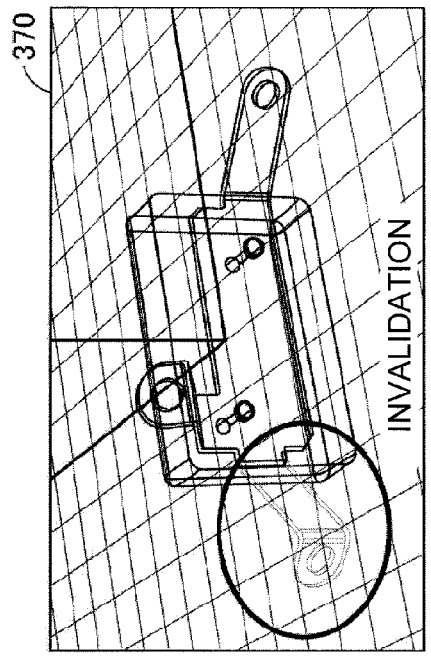
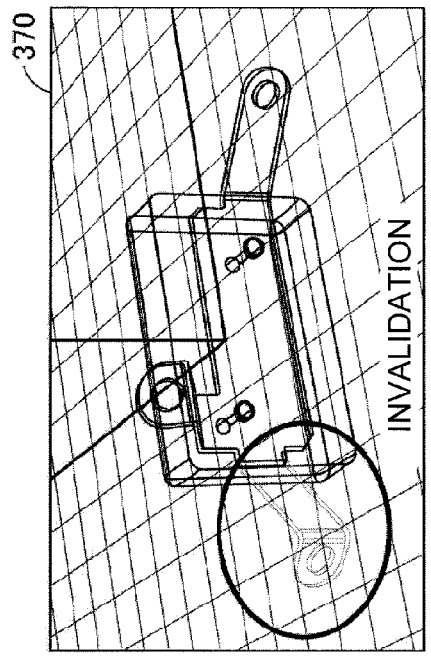
FIG. 14A
FIG. 14B

MODEL PRODUCING APPARATUS, MODEL PRODUCING METHOD, AND COMPUTER-READABLE RECORDING MEDIUM IN WHICH MODEL PRODUCING PROGRAM IS STORED

BACKGROUND OF THE INVENTION

1. Technical Field

The present invention relates to a technology of producing three-dimensional model data, which is used in processing of acquiring three-dimensional information from image data obtained by imaging an object with plural cameras and checking the acquired three-dimensional information against the three-dimensional model data to perform three-dimensional recognition to the object.

2. Related Art

Conventionally, a method for imaging a real object with plural cameras and acquiring (restoring) the three-dimensional information of the object based on plural pieces of image data obtained by the imaging of each camera is proposed as one of an image processing technology. Processing of recognizing (specifying) a type of the object or processing of specifying a position or a posture of the object is performed using the three-dimensional information.

In such cases, three-dimensional model data in which the object is defined is previously prepared, and the three-dimensional model data is checked against the acquired three-dimensional information, thereby specifying the type, position, and posture of the object.

For example, Japanese Unexamined Patent Publication No. 2000-099760 discloses a method for producing a three-dimensional physical body model based on a stereo image that is obtained by observing a physical body from different directions. More specifically, in the method, stereo measurement is performed to a real model of a recognition target from plural directions, and the pieces of three-dimensional information acquired by the measurements are aligned and unified to produce a geometrical model of the whole physical body.

There is disclosed a technique of recognizing the position or posture of the physical body by checking the acquired three-dimensional information against the previously-registered three-dimensional model data (see Yoshihiro Kawai, et al., "Stereo Correspondence Using Segment Connectivity", Transaction of Information Processing Society of Japan, August 1999, Vol. 40, No. 8, p. 3219-3229)

However, in the three-dimensional physical body producing method disclosed in Japanese Unexamined Patent Publication No. 2000-099760, because the three-dimensional model is produced by imaging the object that exists in reality, unfortunately there is a significant processing amount necessary to produce the three-dimensional model. In the technique called "segment-based stereo" (see Yoshihiro Kawai, et al., "Stereo Correspondence Using Segment Connectivity", Transaction of Information Processing Society of Japan, August 1999, Vol. 40, No. 8, p. 3219-3229), an edge in the stereo image is divided into units called "segments", and stereo correlation evaluation is performed in units of segments to acquire three-dimensional information on an outline. Therefore, when a condition to image the object varies temporally, unfortunately the three-dimensional model is produced while an error is accumulated.

SUMMARY

One or more embodiments of the present invention provides a model producing apparatus and a model producing program, which can acquire the three-dimensional information from the image data obtained by imaging the object with plural cameras and check the acquired three-dimensional information against the three-dimensional model data to produce the three-dimensional model data used in the processing of performing the three-dimensional recognition to the object.

In accordance with one aspect of the present invention, there is provided a model producing apparatus that produces three-dimensional model data, which is used in processing of acquiring three-dimensional information from image data obtained by imaging an object with plural cameras and of checking the acquired three-dimensional information against the three-dimensional model data to perform three-dimensional recognition to the object. The model producing apparatus includes: input unit for receiving design data in which a structure of the object is defined as a combination of first elements partitioned by a boundary line; producing unit for producing the three-dimensional model data by hierarchically defining a boundary point of a second element, a segment, and a boundary line between the second elements adjacent to each other, the second element including one or the plurality of first elements that are defined by the received design data, the segment being formed by joining the boundary points; and display unit for sterically displaying the object defined by the design data and a three-dimensional model defined by the produced three-dimensional model data side by side.

According to one or more embodiments of the present invention, the producing unit updates the three-dimensional model data in response to an instruction from an outside while the object and the three-dimensional model are sterically displayed side by side.

According to one or more embodiments of the present invention, the producing unit extracts an element satisfying a predetermined producing condition in the first and second elements included in the design data, and the producing unit produces the three-dimensional model data from the extracted element.

According to one or more embodiments of the present invention, the producing condition includes a threshold relating to an area of the first element included in the design data, and the producing unit removes the first element smaller than the area of the threshold from a producing target of the three-dimensional model data in the first elements included in the design data.

According to one or more embodiments of the present invention, the producing condition includes information indicating a specific geometric shape included in the design data, and the producing unit removes a portion corresponding to the specific geometric shape from a producing target of the three-dimensional model data.

According to one or more embodiments of the present invention, the second element defined by the design data includes information on a plane constituting the object, and the producing unit extracts a plane whose normal line intersects another plane in planes defined by the design data, the producing unit determines that the extracted plane is a portion that is not visually recognized from an outside of the object, and the producing unit removes the extracted plane from a producing target of the three-dimensional model data.

According to one or more embodiments of the present invention, the display unit displays a recognition result obtained by performing the three-dimensional recognition using the produced three-dimensional model data while correlating the recognition result with the three-dimensional model, and the producing unit updates the three-dimensional model data according to an edit manipulation performed to the three-dimensional model, the three-dimensional model being displayed while correlated with the recognition result.

According to one or more embodiments of the present invention, the above model producing apparatus further includes simulation unit for simulating a state in which the object defined by the design data is visually recognized according to an instructed imaging condition, wherein the display unit displays the state in which the object obtained by the simulation unit is visually recognized in parallel with the three-dimensional model defined by the three-dimensional model data.

Another aspect of the present invention provides a model producing program that produces three-dimensional model data, which is used in processing of acquiring three-dimensional information from image data obtained by imaging an object with plural cameras and of checking the acquired three-dimensional information against the three-dimensional model data to perform three-dimensional recognition to the object. The model producing program causes a computer to perform the steps of: receiving design data in which a structure of the object is defined as a combination of first elements partitioned by a boundary line; producing the three-dimensional model data by hierarchically defining a boundary point of a second element, a segment, and a boundary line between the second elements adjacent to each other, the second element including one or the plurality of first elements that are defined by the received design data, the segment being formed by joining the boundary points; and displaying sterically the object defined by the design data and a three-dimensional model defined by the produced three-dimensional model data side by side.

According to one or more embodiments of the invention, the three-dimensional model data used in the processing of performing the three-dimensional recognition can easily be produced.

BRIEF DESCRIPTION OF THE DRAWINGS

FIG. 10 is a view for explaining a data structure of CAD data according to an embodiment of the invention;

FIG. 14 is a view for explaining a free edit function provided in the model producing apparatus of an embodiment of the present invention;

DETAILED DESCRIPTION

Figure 1:
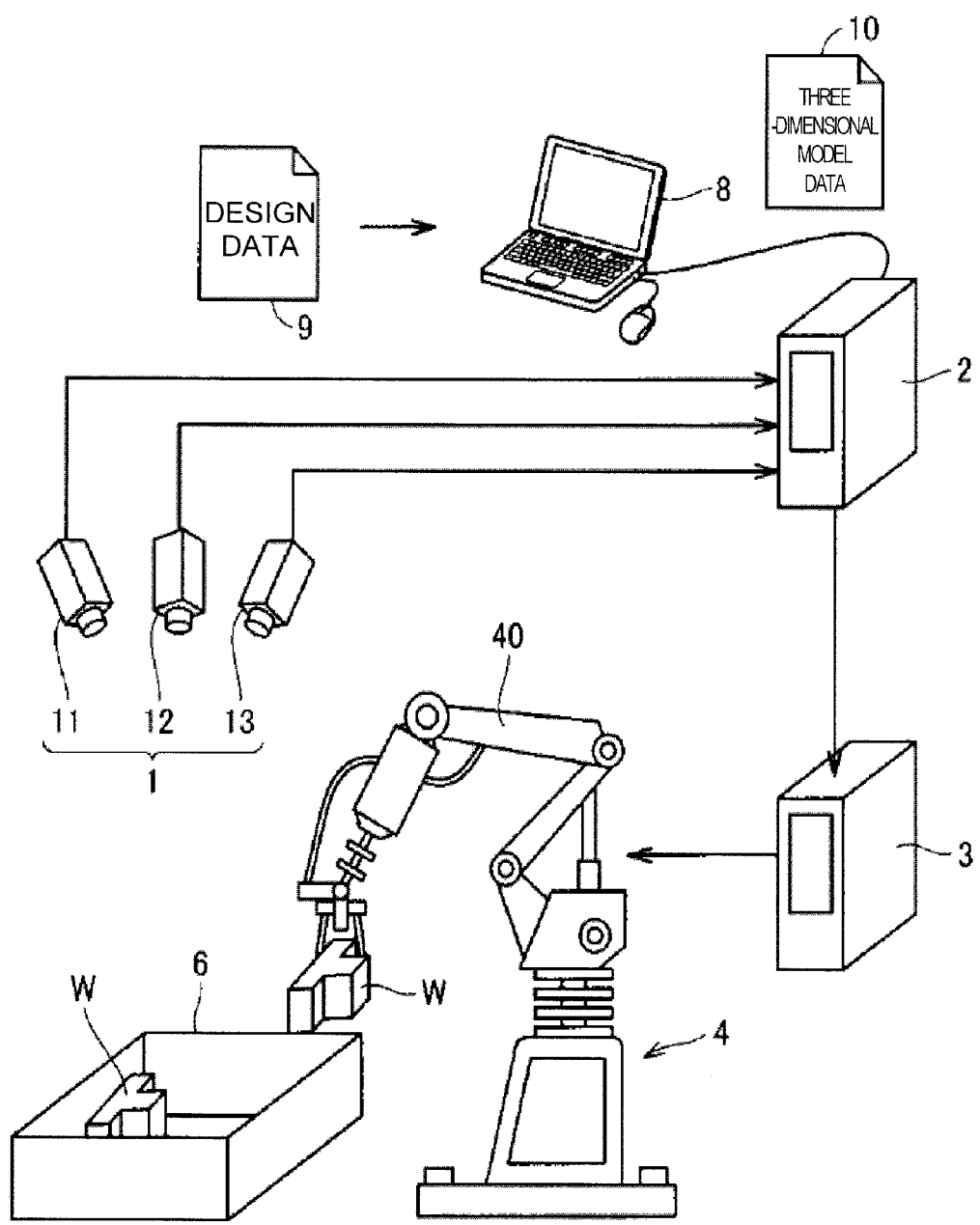
FIG. 1 is a schematic diagram illustrating an entire configuration of a picking system according to an embodiment of the invention.

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. In the drawings, the same or equivalent constituent is designated by the same numeral, and the overlap description is omitted.

<A. Picking System>

A picking system will be described by way of example as a system to which three-dimensional model data acquired through three-dimensional model data producing processing according to an embodiment of the invention is applied. Hereinafter, processing of checking three-dimensional information, acquired from image data in which an object is imaged with plural cameras, against previously-acquired three-dimensional model data to recognize a position and a posture or a type of the object is also referred to as "three-dimensional recognition processing". The three-dimensional model data includes information indicating a three-dimensional shape of a physical body that becomes a recognition target. Visualization or substance of the information defined by the three-dimensional model data is also referred to as a "three-dimensional model".

FIG. 1 is a schematic diagram illustrating an entire configuration of a picking system 100 according to an embodiment of the invention. As illustrated in FIG. 1, for example, the picking system 100 according to one or more embodiments of the present invention performs a task of taking out a workpiece W one by one from an accommodation box 6, in which plural workpieces W are accommodated, to move the workpiece W to a predetermined position on a production line.

More specifically, the picking system 100 includes a stereo camera 1, a sensor controller 2, a robot controller 3, and a multijoint robot 4. The stereo camera 1 and the sensor controller 2 correspond to a picking sensor that recognizes a type, a position and a posture of the workpiece W of a three-dimensional recognition processing target.

The stereo camera 1 includes plural camera (in the example illustrated in FIG. 1, the total of three cameras 11, 12, and 13), and the stereo camera 1 images the workpiece W accommodated in the accommodation box 6. A positional relationship among the cameras 11, 12, and 13 is fixed. The three pieces of image data acquired by the imaging of the three cameras 11, 12, and 13 are transmitted to the sensor controller 2.

The sensor controller 2 acquires three-dimensional information on the subject from the three pieces of image data acquired by the imaging of the three cameras 11, 12, and 13 based on pieces of information indicating the positional relationship among the three cameras 11, 12, and 13 and an orientation of an optical axis. The acquired three-dimensional information mainly includes information indicating an outline (edge portion in the image) of the subject.

Three-dimensional model data 10 of the workpiece W to be recognized is previously registered in the sensor controller 2, and the sensor controller 2 checks the acquired three-dimensional information against the three-dimensional model data 10 to recognize the type, position, and posture of the workpiece W. When plural types of the workpieces W are accommodated in the accommodation box 6, the three-dimensional model data 10 is registered in each type of the accommodated workpiece W, and the type of the workpiece W is specified based on which type of the three-dimensional model data 10 is matched with the acquired three-dimensional information.

The sensor controller 2 issues a control command, which is necessary for the multijoint robot 4 to pick the workpiece W, to the robot controller 3 based on the position or posture of the recognized workpiece W. That is, the sensor controller 2 issues the command to control the operation of the multijoint robot 4 to the robot controller 3 based on the recognition result.

The robot controller 3 controls the multijoint robot 4 according to the control command from the sensor controller 2. The multijoint robot 4 operates an arm 40 to move the recognized workpiece W to the target position according to the control command from the sensor controller 2.

Particularly, in the picking system 100 according to one or more embodiments of the present invention, it is not necessary to image the real workpiece W (reference workpiece) in order to acquire the previously-registered three-dimensional model data 10. Instead, the three-dimensional model data 10 is produced based on design data 9 of the workpiece W of the recognition target. Typically, the three-dimensional model data 10 is produced based on design data 9 on a computer 8 that can be connected to the sensor controller 2. The produced three-dimensional model data 10 is transferred from the computer 8 to the sensor controller 2. The three-dimensional model data producing processing is described in detail later.

Figure 2:
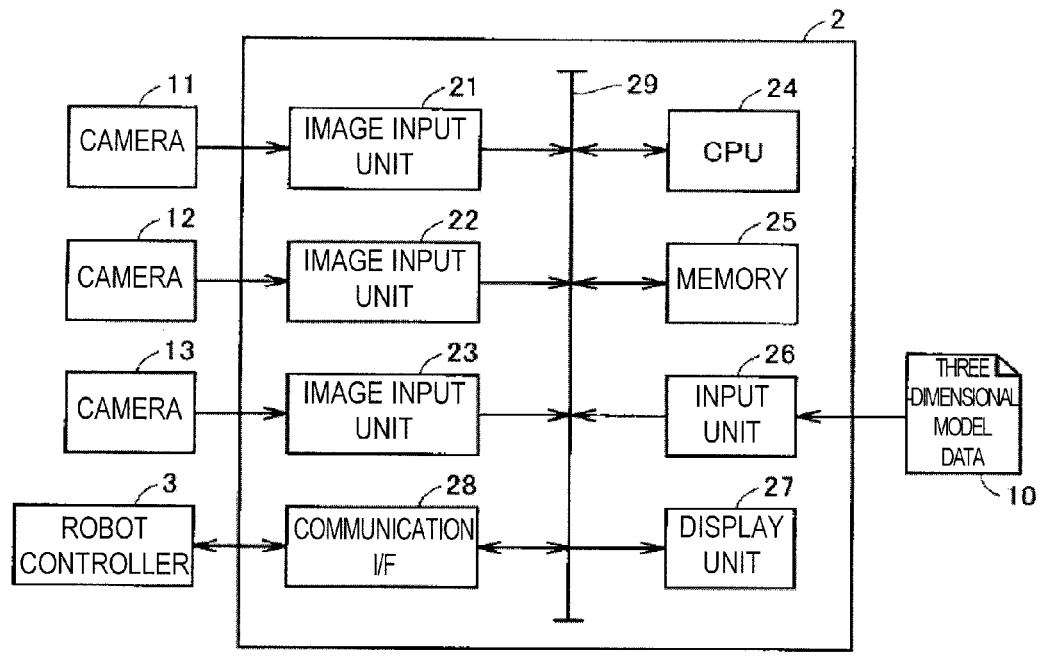
FIG. 2 is a schematic diagram illustrating a hardware configuration in which a sensor controller illustrated in FIG. 1 is centered.

FIG. 2 is a schematic diagram illustrating a hardware configuration in which the sensor controller 2 illustrated in FIG. 1 is centered. Referring to FIG. 2, the sensor controller 2 includes three image input units 21, 22, and 23 corresponding to the three cameras 11, 12, and 13. The image data obtained by the imaging of the corresponding camera is tentatively stored in each of the image input units 21, 22, and 23, and each of the image input units 21, 22, and 23 controls an imaging operation (such as imaging timing and an exposure time) of the corresponding camera.

The sensor controller 2 includes a CPU (Central Processing unit) 24 that performs main part of the three-dimensional recognition processing, a memory 25 in which a program executed in the CPU 24 and workpiece data are retained, an input unit 26 that receives the three-dimensional model data 10 from the computer 8, a display unit 27 that notifies a user of the recognition result and the like, and a communication interface (I/F) 28 that conducts communication with the robot controller 3. The units can conduct data communication with one another through a bus 29.

The CPU 24 performs a sequence of pieces of processing relating to the imaging of the workpiece W with the cameras 11, 12, and 13 and the recognition of the workpiece W according to the program stored in the memory 25, and the CPU 24 outputs the three-dimensional model data 10 including the recognition result (specifically, the type of the workpiece W, a three-dimensional coordinate expressing the position of the workpiece W, and a rotation angle with respect to the three-dimensional model data) to the robot controller 3 through the communication I/F 28.

Typically the memory 25 includes a nonvolatile ROM (Read Only Memory), a volatile RAM (Random Access Memory), and a hard disk. The input unit 26 includes a keyboard and a mouse, and the display unit 27 includes a liquid crystal monitor.

Figure 3:
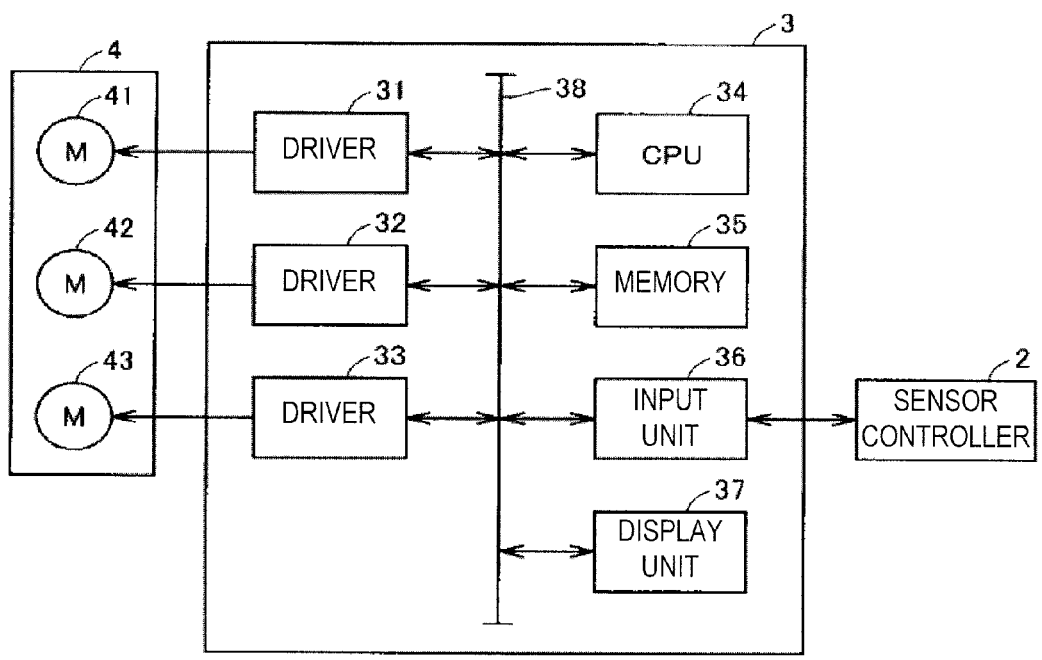
FIG. 3 is a schematic diagram illustrating a hardware configuration in which a robot controller illustrated in FIG. 1 is centered.

FIG. 3 is a schematic diagram illustrating a hardware configuration in which the robot controller 3 illustrated in FIG. 1 is centered. FIG. 3 illustrates an example of the three-axis multijoint robot 4. The multijoint robot 4 includes three motors 41, 42, and 43 that drive joints. The robot controller 3 includes three drivers 31, 32, and 33 corresponding to the motors 41, 42, and 43. Typically each of the motors 41, 42, and 43 includes a stepping motor, each of the drivers 31, 32, and 33 outputs a pulse string according to a displacement amount by which the corresponding motor (joint) should move.

The robot controller 3 includes a CPU (Central Processing Unit) 34 that mainly performs processing of operating the multijoint robot 4, a memory 35 in which a program executed in the CPU 34 and workpiece data are retained, a communication interface (I/F) 36 that conducts communication with the sensor controller 2 to receive the control command, and a display unit 37 that notifies the user of an operating state of the multijoint robot 4. The units can conduct data communication with one another through a bus 38.

The CPU 34 performs a sequence of pieces of processing of driving the motors 41, 42, and 43 according to the program stored in the memory 35 and the control command received from the sensor controller 2. The memory 35 includes a nonvolatile ROM, a volatile RAM, and a hard disk. The display unit 37 includes a liquid crystal monitor.

<B. Three-Dimensional Recognition Processing>

An outline of the three-dimensional recognition processing performed in the sensor controller 2 according to one or more embodiments of the present invention will be described below.

The sensor controller 2 detects the edge corresponding to an outline of the workpiece W from the three pieces of image data (stereo image) acquired by the imaging of each of the cameras 11, 12, and 13. Then the sensor controller 2 produces (restores) the three-dimensional information in units called "segments". The sensor controller 2 checks the three-dimensional information produced against the three-dimensional model data in units of segments.

Figure 4:
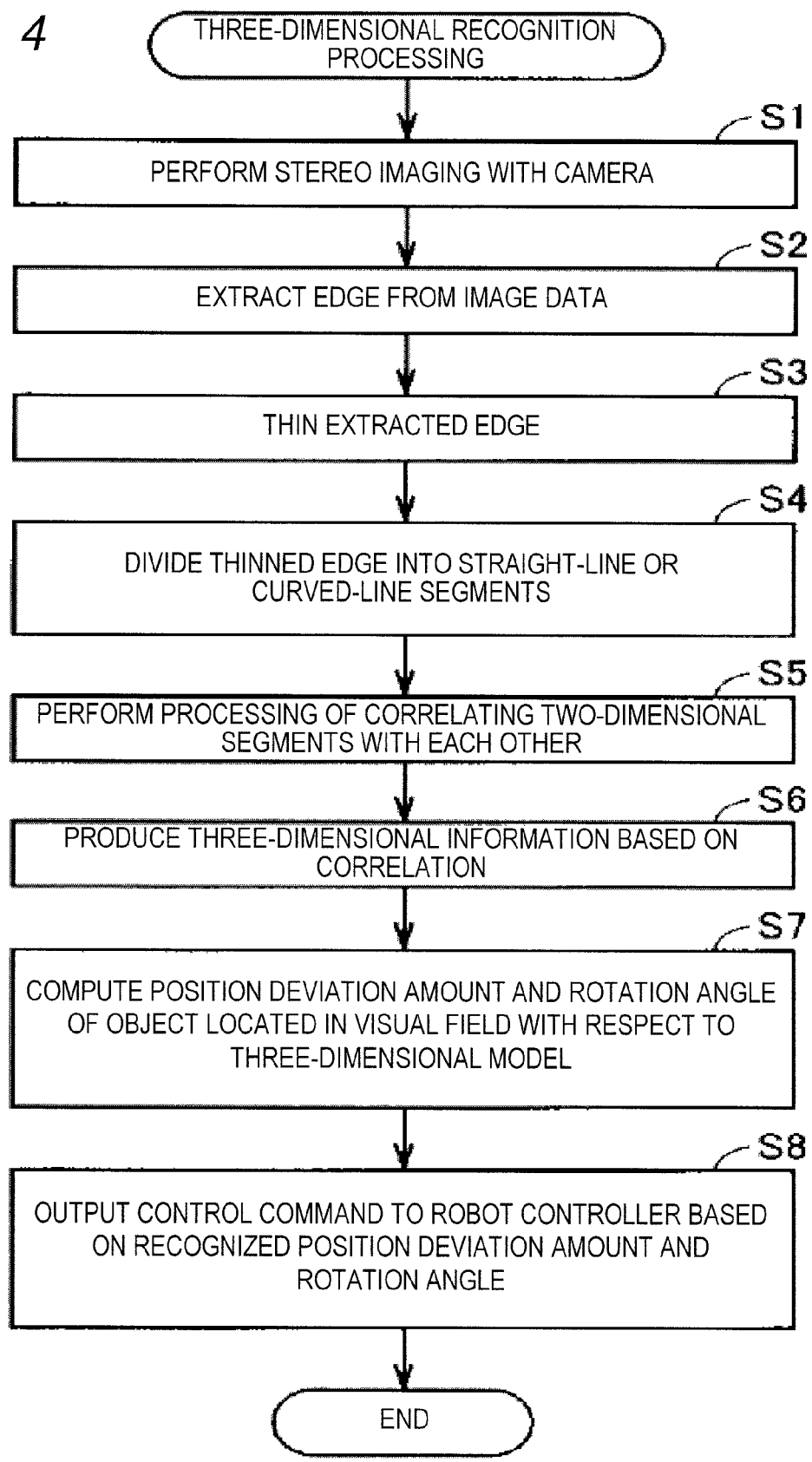
FIG. 4 is a flowchart illustrating a procedure of three-dimensional recognition processing according to an embodiment of the invention.

FIG. 4 is a flowchart illustrating a procedure of the three-dimensional recognition processing according to one or more embodiments of the present invention. Referring to FIG. 4, the sensor controller 2 causes the cameras 11, 12, and 13 to perform the imaging (stereo imaging) (Step S1). Then the sensor controller 2 extracts the edge from the image data acquired by the imaging of each of the cameras 11, 12, and 13 (Step S2). Typically the edge extraction is realized by applying an edge extracting filter to the image data. The sensor controller 2 thins each of the extracted edges (converts the extracted edge into data having one-pixel width) (Step S3), and the sensor controller 2 divides the thinned edge into straight-line or curved-line segments based on a connecting point and/or a branching point (Step S4).

Hereinafter, the segment obtained through the processing is referred to as a "two-dimensional segment".

The sensor controller 2 performs processing of correlating the two-dimensional segments with each other among plural pieces of image data (Step S5). More specifically, based on one piece of image data in the three pieces of image data acquired from the cameras 11, 12, and 13, the sensor controller 2 sequentially selects the two-dimensional segment that should be interested on according to the sequence of the two-dimensional segment included in the reference image data. The sensor controller 2 specifies the correlated two-dimensional segment from the two pieces of image data except the reference data in each two-dimensional segment. That is, the two-dimensional segment, which satisfies a predetermined condition (a so-called epipolar condition) and has a connection relationship with another segment located nearby, is extracted from the other two pieces of image data in each interested two-dimensional segment included in the reference image data.

When the processing is completed, the sensor controller 2 performs processing of producing the three-dimensional information based on the correlation of each combination of the two-dimensional segments correlated with each other (Step S6). More specifically, the sensor controller 2 computes three-dimensional coordinates of pixels having the correlation between the segments in each combination of the two-dimensional segments correlated with each other. The sensor controller 2 checks a distribution state of the computed three-dimensional coordinates against the straight-line and curved-line models to determine whether the set of three-dimensional coordinates correlated with the straight line or the curved line. In each combination of the two-dimensional segments, the straight-line or curved-line three-dimensional segment correlated with the combination is specified through the determination processing.

In the processing in Step S6, the sensor controller 2 samples each three-dimensional segment at predetermined intervals to acquire information in which the type (straight line or curved line) of the segment and the three-dimensional coordinate at the sampling point are correlated with each other. Therefore, for the three-dimensional segment in which a small number of three-dimensional coordinates is computed from the two-dimensional segment, many three-dimensional coordinates can be acquired by finely setting the sampling interval.

The set of three-dimensional segments acquired by performing the processing corresponds to the three-dimensional information indicating the object located in a visual field of each of the cameras 11, 12, and 13.

Then the sensor controller 2 sets the three-dimensional model data to a predetermined reference position of a three-dimensional coordinate system, and the sensor controller 2 checks the three-dimensional model data and the acquired three-dimensional information to compute a position deviation amount and a rotation angle of the object (workpiece W) located in the visual field with respect to the three-dimensional model data (Step S7). In the three-dimensional model data, a positional relationship between the elements included in the three-dimensional model data is defined in an independent three-dimensional coordinate system. Therefore, in order to compare the three-dimensional model data to the three-dimensional information obtained by the imaging of the stereo camera 1, it is necessary that the three-dimensional model data and the three-dimensional information be compared to each other in the common three-dimensional coordinate system. In Step S7, the three-dimensional coordinate system used to define the acquired three-dimensional information is used as the common coordinate system to reconstruct the definition of the three-dimensional model data. In the checking processing in Step S7, each intersection point of the three-dimensional segments is set to a feature point, a degree of coincidence between the three-dimensional segments is computed when the correlation is performed while feature points are correlated with one another in a round-robin manner, and the correlation having the maximum degree of coincidence is specified as the correct correspondence relationship.

More specifically, the feature points are correlated according to the sequence of the feature point of the three-dimensional information on the object (workpiece W) located in the visual field, and the shift amount and rotation angle necessary to move the feature point on the three-dimensional model data side to the correlation point is computed in each correlation. The shift amount and the rotation angle are computed in each of X-, Y-, and Z-axes. All the coordinates included in the three-dimensional model data are converted based on the computed shift amount and rotation angle to compute the degree of coincidence between the three-dimensional model data of the post-conversion and the three-dimensional information of the checking target.

The feature points are correlated in the round-robin manner by performing the processing to all the feature point on the three-dimensional model data side, which allows the degree of coincidence to be determined in each correlation. Then the shift amount and rotation angle, which are used for the coordinate conversion in obtaining the finally highest degree of coincidence, are recognized as the position deviation amount and the rotation angle with respect to the three-dimensional model data of the object (workpiece W) located in the visual field.

The sensor controller 2 outputs the control command to the robot controller 3 based on the recognized position deviation amount and rotation angle (Step S8). Then the processing is ended.

<C. Conventional Three-Dimensional Model Data Producing Processing>

In describing the three-dimensional model data producing processing according to one or more embodiments of the present invention, conventional three-dimensional model data producing processing will be described below.

Figure 5:
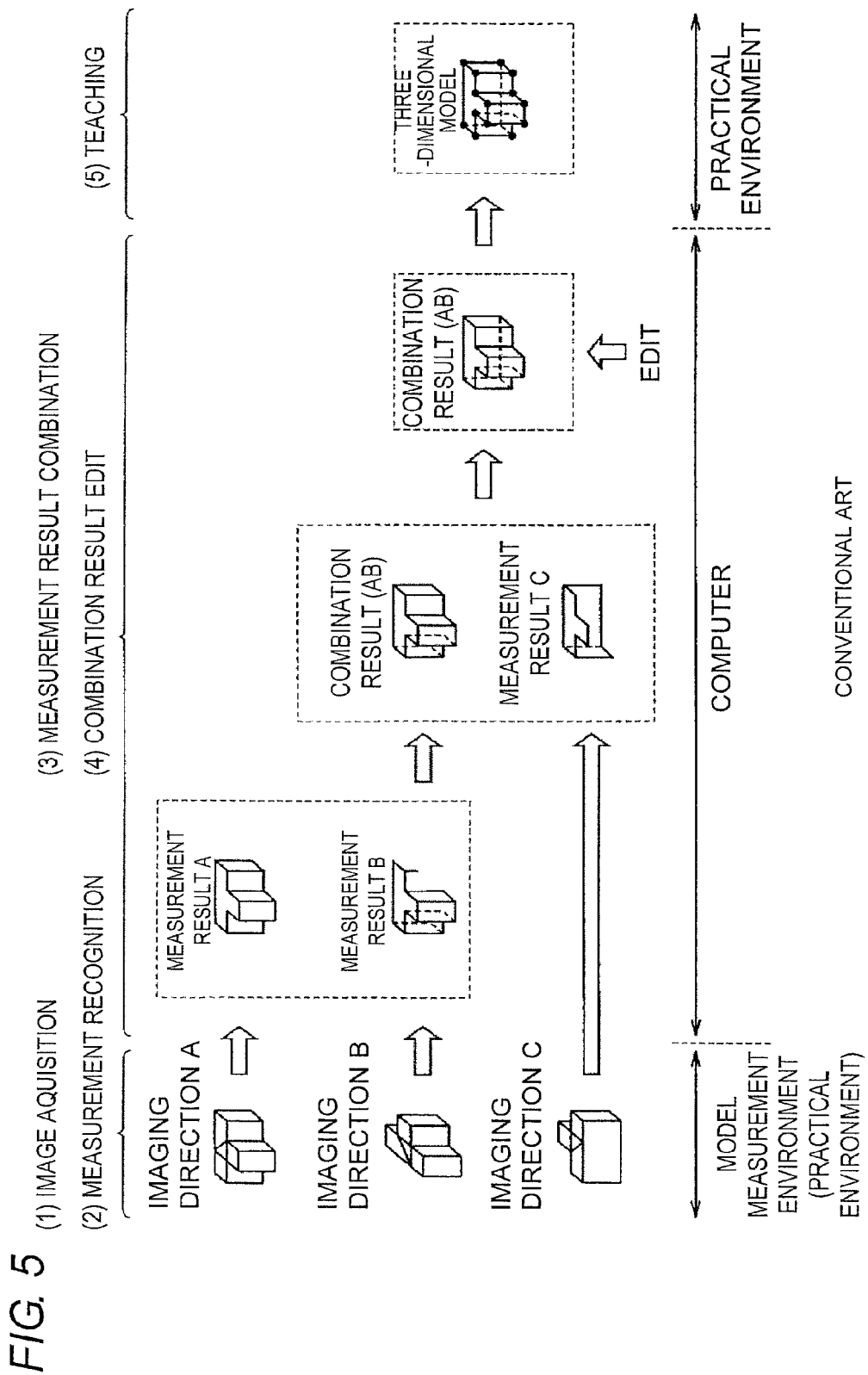
FIG. 5 is a view for explaining a procedure of three-dimensional model data producing processing based on a real model relating to one or more embodiments of the invention.
Figure 6:
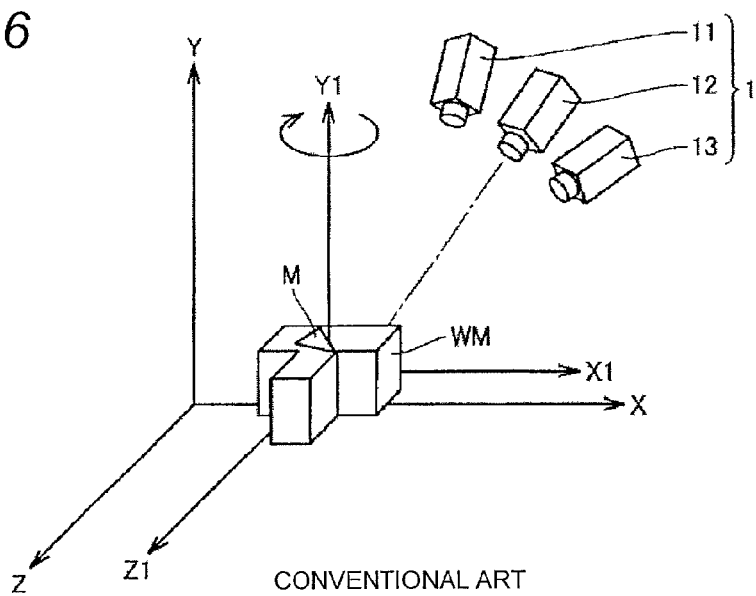
FIG. 6 is a view for explaining processing performed in a model measurement environment illustrated in FIG. 5.

FIG. 5 is a view for explaining a procedure of the three-dimensional model data producing processing based on a real model relating to one or more embodiments of the invention. FIG. 6 is a view for explaining processing performed in a model measurement environment illustrated in FIG. 5.

When the three-dimensional model data is produced based on the real model, the stereo imaging is performed to a real model (hereinafter referred to as "workpiece model WM") of the workpiece W from various directions, and the measurement results recognized from the pieces of image data obtained by the stereo imaging is unified to produce the three-dimensional model data.

More specifically, as illustrated in FIG. 5, the conventional three-dimensional model data producing processing includes (1) image acquisition processing that is performed in a model measurement environment (substantially identical to the practical environment), (2) measurement recognition processing, (3) measurement result combination processing performed on the computer, (4) combination result edit processing performed on the computer, and (5) teaching processing performed on the practical environment.

In the (1) image acquisition processing in the model measurement environment illustrated in FIG. 5, the workpiece model WM is imaged with the cameras 11, 12, and 13 as illustrated in FIG. 6 in the environment that is substantially identical to the environment in which the three-dimensional recognition processing is performed, that is, the environment illustrated in FIG. 1.

More specifically, as illustrated in FIG. 6, the position and optical axis direction of the stereo camera 1 are fixed, and the stereo imaging is performed plural times while the posture of the workpiece model WM relative to the stereo camera 1 is changed.

A three-dimensional coordinate system defined by X-, Y-, and Z-axes illustrated in FIG. 6 is a coordinate system that is used to compute the three-dimensional coordinate and uniquely defined with respect to the stereo camera 1. On the other hand, a three-dimensional coordinate system defined by X1-, Y1-, and Z1-axes is a coordinate system that is uniquely defined with respect to the workpiece model WM. For example, assuming that a specific plane along an X1-Z1 plane is always in contact with a workpiece supporting surface (in this example, X-Z plane), the stereo imaging is performed plural times while the workpiece model WM rotates one revolution with respect to Y1-axis orthogonal to an X-Z plane.

In the example illustrated in FIG. 6, the stereo imaging is performed while a mark M is adhered to the surface of the workpiece model WM in order to specify the position. Each stereo imaging position (posture of workpiece model WM) is determined on the condition that the mark M is included in all the visual fields of the cameras 11, 12, and 13 constituting the stereo camera 1. Therefore, in the (2) measurement recognition processing, the three-dimensional information including the three-dimensional segment expressing the mark M can be acquired with respect to all the pieces of image data.

Referring to FIG. 5, in the (2) measurement recognition processing, the three-dimensional information indicating the outline (edge portion in image) of the subject in each of the plural imaging directions (postures of the workpiece model WM with respect to the stereo camera 1) in which the stereo imaging is performed (three-dimensional measurement). The three-dimensional information includes each coordinate indicating the outline on the three-dimensional coordinate system. FIG. 5 illustrates an example in which the pieces of three-dimensional information (measurement result) are produced in the three imaging directions A, B, and C.

Because each of the pieces of three-dimensional information produced through the pieces of processing (1) and (2) reconstruct the pieces of image data imaged with the plural cameras, unfortunately an error is easily generated. Additionally, because the stereo imaging is performed plural times by varying the posture of the workpiece model WM, the stereo imaging is easily influenced by a temporal change of the imaging environment.

Then the pieces of three-dimensional information in the different imaging directions, produced through the pieces of processing (1) and (2), are combined on the computer with respect to the workpiece model WM. More specifically, in the (3) measurement result combination processing, for example, the correlation (alignment) is performed between a measurement result A in an imaging direction A and a measurement result B in an imaging direction B based on information on the common three-dimensional feature (a coordinate (X,Y,X) and an angle $(\theta, \gamma, \epsilon)$ of the feature point on the three-dimensional coordinate system). Therefore, the pieces of three-dimensional information obtained in the imaging direction A and imaging direction B are combined to produce a combination result (AB). Similarly the correlation (alignment) is performed between the combination result (AB) and a measurement result C in an imaging direction C based on the information on the common three-dimensional feature. Therefore, the pieces of three-dimensional information obtained in the imaging direction A, the imaging direction B, and the imaging direction C are combined to produce a combination result (ABC). The edit processing ((4) combination result edit processing) is performed to the produced combination result (ABC). Therefore, the three-dimensional model data of the workpiece model WM is completed.

Because an alignment error is easily generated in the (3) measurement result combination processing, the combination result does not always express the correct outline of the workpiece model WM. In the (4) combination result edit processing, although the combination result can be edited in order to remove the error, how to edit the combination result depends largely on experiences and, thus, quality of the three-dimensional model data depends on a model data producer.

Accordingly, due to various factors, the errors are probably accumulated in the three-dimensional model data that is applied to the practical environment through the (5) teaching processing.

<D. Three-dimensional Model Data Producing Processing of an Embodiment>

As described above, when the three-dimensional model data is produced using the real model (workpiece model WM) of the workpiece W, unfortunately it is necessary to really image the workpiece model WM, and the errors are accumulated in the produced three-dimensional model data. Therefore, according to one or more embodiments of the present invention, the three-dimensional model data is produced based on design data of the workpiece W.

The workpiece W dealt with by the picking system 100 illustrated in FIG. 1 is produced through an industrial process, and a design drawing of the workpiece W is usually prepared. Currently, frequently product design is made on the computer, and it is easy to previously acquire design information that can electronically be dealt with. Typically the product design (or drawing) is performed on the computer using so-called CAD (Computer Aided Design).

Therefore, in the three-dimensional model data producing processing according to one or more embodiments of the present invention, the three-dimensional model data is produced using the design data (CAD data) of the object to be recognized.

Figure 7:
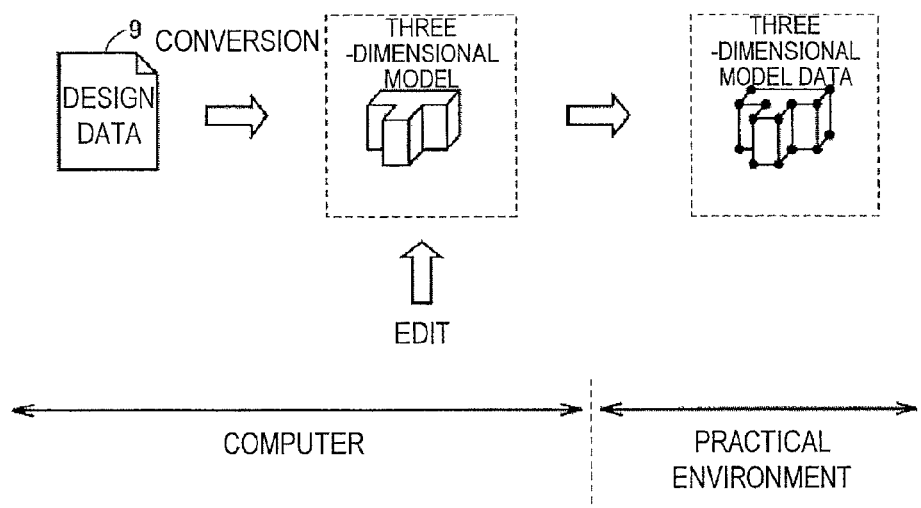
FIG. 7 is a view for explaining a procedure of three-dimensional model data producing processing according to an embodiment of the invention.

FIG. 7 is a view for explaining a procedure of the three-dimensional model data producing processing according to an embodiment of the invention. Referring to FIG. 7, the three-dimensional model data producing processing according to one or more embodiments of the present invention includes the conversion processing and edit processing, which are performed on the computer to the design data, and teaching processing performed in the practical environment. In the three-dimensional model data producing processing according to one or more embodiments of the present invention, it is not necessary to image the workpiece model WM, which allows shortening of a time necessary to produce the three-dimensional model data. The measurement recognition processing and the measurement result combination processing are also removed, so that the accumulation of the error can be avoided in the produced three-dimensional model data. Therefore, the quality of the produced three-dimensional model data can be stabilized.

<E. Performance Environment of Three-dimensional Model Data Producing Processing>

A model producing apparatus 200 according to an embodiment of the invention is typically implemented such that a computer (processor) executes an installed program. Alternatively, a part or a whole of a function that is provided by causing the computer to execute the program may be implemented as a dedicated hardware circuit.

Figure 8:
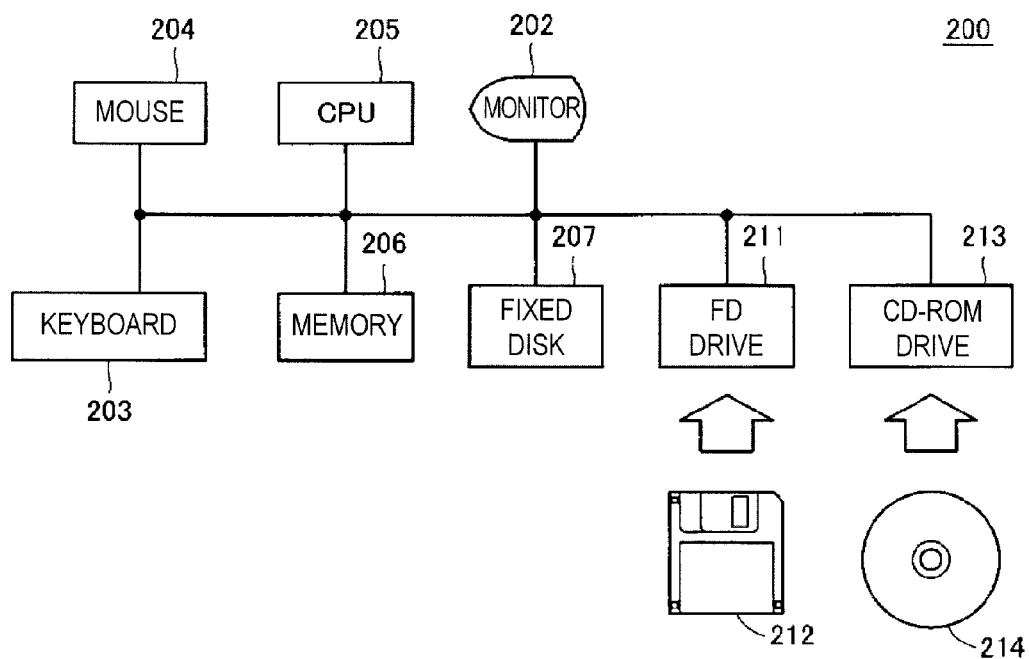
FIG. 8 is a schematic configuration diagram of a computer that implements a model producing apparatus according to an embodiment of the invention.

FIG. 8 is a schematic configuration diagram of the computer that implements the model producing apparatus 200 according to one or more embodiments of the present invention. Referring to FIG. 8, the computer that implements the model producing apparatus 200 includes a monitor 202 that is of a display device, a keyboard 203 and a mouse 204 that are of an input device, a CPU 205 that is of an arithmetic device (processor), a memory 206 and a fixed disk 207 that are of a storage device, and a FD drive 211 and a CD-ROM drive 213 that are of a data read device reading data from a recording medium. The units are connected to one another while being able to conduct data communication with one another through a bus.

Typically the program executed by the model producing apparatus 200 (computer) is distributed while stored in a Flexible Disk (FD) 212 or a CD-ROM (Compact Disk Read Only Memory) 214, or the program is distributed by download from a delivery server device connected to a network. The programs stored in the flexible disk 212 and CD-ROM 214 are read from the FD drive 211 and CD-ROM drive 213, respectively, and the programs are tentatively stored in the fixed disk 207. The programs are expanded in the memory 206 from the fixed disk 207, and the CPU 205 executes the programs.

The CPU 205 sequentially executes programmed commands to perform various calculations. Various pieces of information are also tentatively stored in the memory 206 according to the program execution in the CPU 205. The fixed disk 207 is a nonvolatile storage device in which the design data (CAD data) of the processing target and various setting values are stored in addition to the program executed by the CPU 205.

The keyboard 203 receives the command from the user according to an input key. The mouse 204 receives the command from the user according to operations such as click and slide. The command received by the keyboard 203 and mouse 204 are provided to the CPU 205. Other output devices such as a printer may be connected to the model producing apparatus 200 as needed.

<F. Functional Block relating to Three-dimensional Model Data Producing Processing>

A functional block that provides the function in the model producing apparatus 200 according to one or more embodiments of the present invention will be described below.

Figure 9:
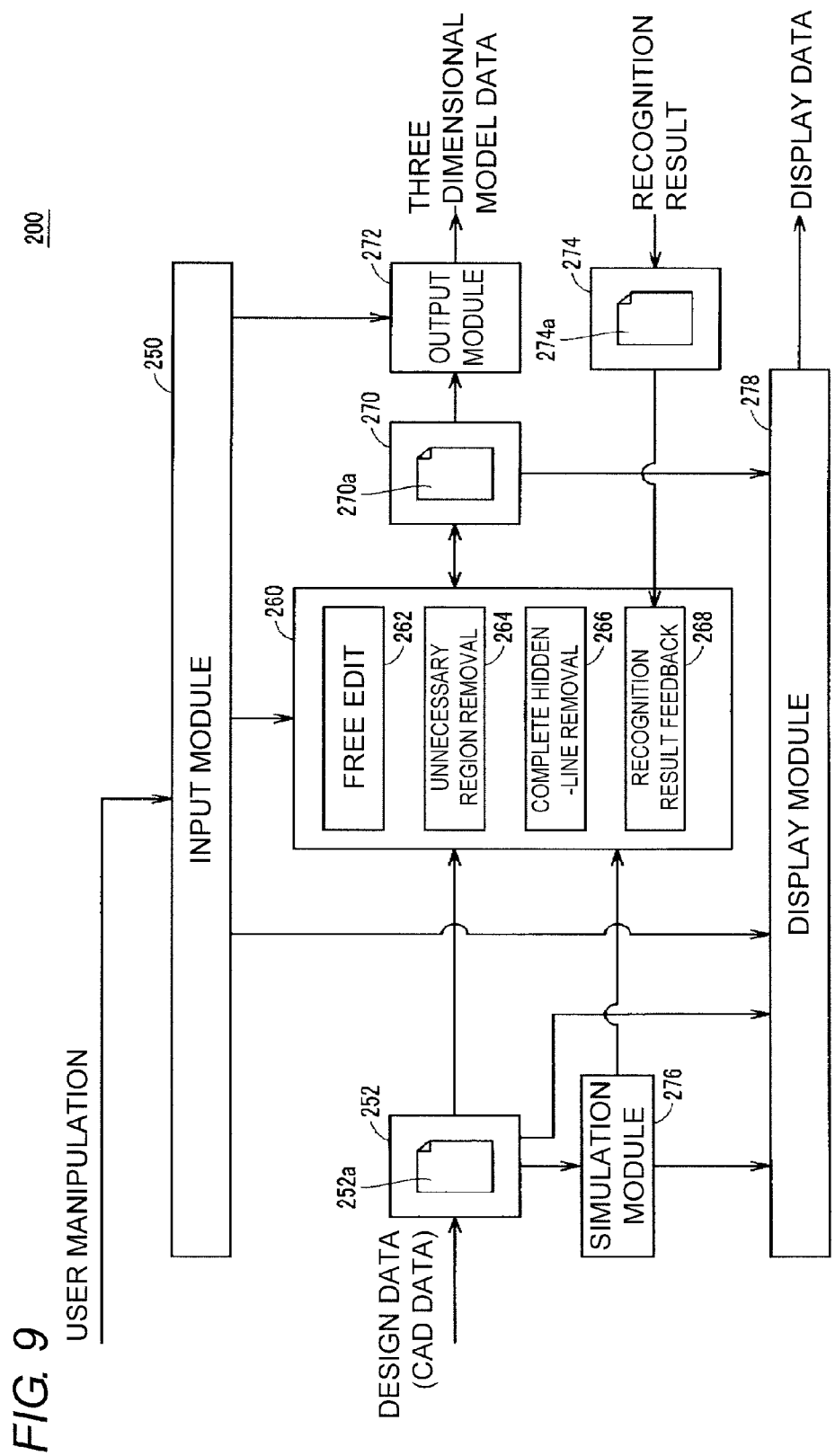
FIG. 9 is a functional block diagram illustrating a control structure of the model producing apparatus of an embodiment of the invention.

FIG. 9 is a functional block diagram illustrating a control structure of the model producing apparatus 200 according to one or more embodiments of the present invention. Referring to FIG. 9, the model producing apparatus 200 receives the design data (CAD data) to converts the design data into the three-dimensional model data, and the model producing apparatus 200 performs an edit manipulation to the three-dimensional model data obtained by the conversion in response to a user's manipulation.

More specifically, the model producing apparatus 200 includes an input module 250, buffers 252, 270, and 274, a producing module 260, an output module 272, a simulation module 276, and a display module 278 as the control structure.

The input module 250 receives the user's manipulation to provide contents of the manipulation to the producing module 260, the output module 272, and the display module 278.

The buffer 252 tentatively retains input CAD data 252a. For the method for inputting the CAD data 252a, the user selects the CAD data of the workpiece of the three-dimensional model data producing target on an OS (Operating System) executed in the model producing apparatus 200. Alternatively, the target CAD data may be received from another apparatus through a network.

The producing module 260 produces three-dimensional model data 270a based on the information on the CAD data 252a retained by the buffer 252. The three-dimensional model data 270a is retained by the buffer 270.

The CAD data 252a includes information that three-dimensionally expresses the workpiece. More specifically, in the CAD data 252a, each element is defines as boundary line expression (Boundary-Representation). In the CAD data 252a, at least an outer surface of the workpiece is expressed as a combination of plural triangular small regions (hereinafter also referred to as "triangular patch") that are continuously disposed. A shape except the triangle may be used as the small region. A size of the small region changes according to the shape to be expressed. That is, the smaller triangular patch is used as the surface shape becomes complicated. The producing module 260 performs a structural analysis to the CAD data 252a to segment a boundary portion between the triangular patches adjacent to each other, thereby producing the three-dimensional model data. The data structure is described in detail later.

The producing module 260 includes a free edit function 262, an unnecessary region removing function 264, a complete hidden-line removing function 266, and a recognition result feedback function 268.

The free edit function 262 arbitrarily selects a portion used for the recognition in the three-dimensional recognition processing and other portions with respect to the three-dimensional model data, which is produced by the conversion of the CAD data 252a, in response to the user's manipulation.

The unnecessary region removing function 264 removes a portion unnecessary for the recognition in the three-dimensional recognition processing in the elements (components or shapes) included in the CAD data 252a. Typically the unnecessary region removing function 264 causes only the element, which satisfies a condition designated by the user in the elements included in the CAD data 252a, to be included in the three-dimensional model data.

The complete hidden-line removing function 266 removes a portion that is not used for the recognition in the three-dimensional recognition processing in the element (component or shape) included in the CAD data 252a. Typically the complete hidden-line removing function 266 removes the portion, such as an internal structure of the object (workpiece) defined by the CAD data 252a, which cannot be imaged with the stereo camera 1 even in any posture of the workpiece. At this point, a plane (that is not exposed to the outside) that becomes a complete hidden-line is specified by computing the position at which normal lines of the planes constituting the workpiece intersect each other.

The recognition result feedback function 268 facilitates fine-tuning of the three-dimensional model data by reflecting a recognition result 274a during the edit of the three-dimensional model data. The recognition result 274a is obtained by really performing the three-dimensional recognition processing based on the previously produced three-dimensional model data. The recognition result 274a is retained by the buffer 274.

Each function is described in detail later. The output module 272 outputs the three-dimensional model data 270a, retained by the buffer 270, as the three-dimensional model data. More specifically, the output module 272 deletes redundant information included in three-dimensional model data 270a, and the output module 272 outputs information used only in the three-dimensional recognition processing.

The simulation module 276 performs simulation to the CAD data 252a to notify the user of the state recognized on an imaging condition (practical environment) in the picking system 100 in which the three-dimensional recognition processing is really performed. Typically the simulation is performed by reflecting conditions such as a positional relationship of the stereo camera 1 with respect to the workpiece W and a positional relationship of the lighting device with respect to the workpiece W, thereby confirming the edge that is recognized in performing the imaging with the real stereo camera 1.

The display module 278 notifies the monitor 202 (FIG. 8) of the information necessary to produce the three-dimensional model data.

<G. Data Structures of CAD Data and Three-dimensional Model>

FIG. 10 is a view for explaining a data structure of the CAD data 252a according to an embodiment of the invention. FIG. 11 is a view for explaining a data structure of three-dimensional model data according to an embodiment of the invention.

Referring to FIG. 10, the CAD data 252a includes a definition of (A) triangular patch and a definition of (B) plane, which indicate the object to be expressed. The definition of (A) triangular patch includes coordinates (at least three points) of vertexes constituting each triangular patch. That is, each triangular patch is defined with lines (sides) connecting the vertexes adjacent to each other as the boundary line. Information (triangular patch 1, 2, . . . ) specifying one or plural triangular patches, that is, the plural triangular patches that should be dealt with as the same plane is defined as the (B) plane. A normal vector is defined with respect to each plane. The normal vector is information specifying a spreading direction of the corresponding plane, and the normal vector is also used in the later-described complete hidden-line removing function.

The CAD data 252a may include only the definition of (A) triangular patch while not including the definition of (B) plane. In such cases, as described later, the definition of (B) plane can be produced from the definition of (A) triangular patch. Thus, in the CAD data 252a, the object to be expressed is structurally defined as the set of three-dimensional coordinate values of the plural points.

Referring to FIG. 11, similarly to the CAD data 252a illustrated in FIG. 10, the boundary line expression is used in the three-dimensional model data. In the three-dimensional model data, a region is hierarchically defined in the order of the boundary line, the segment, and the boundary point.

Figure 11A:
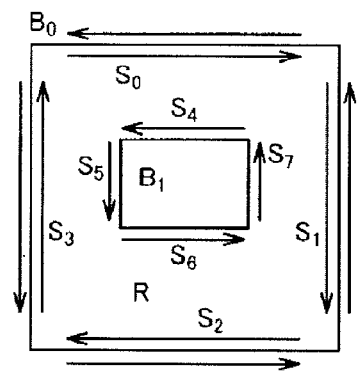
FIG. 11 is a view for explaining a data structure of three-dimensional model data according to an embodiment of the invention.

For example, as illustrated in FIG. 11A, the case where a rectangular boundary line B0 is set on an outer peripheral side while a rectangular boundary line B1 is set on an inner peripheral side is discussed in a substantially square region R. At this point, the boundary line B0 is defined as a set of four segments S0, S1, S2, and S3, and the boundary line B1 is defined as a set of four segments S4, S5, S6, and S7. It is assumed that each segment includes one or plural boundary points. For example, the segment S0 includes boundary points P0, P1, P2, . . . .

Figure 11B:
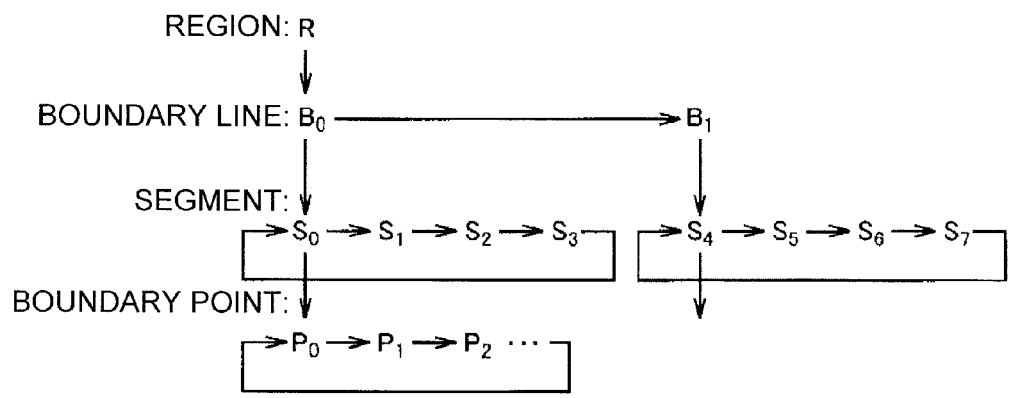

A data structure illustrated in FIG. 11B is adopted in order to define each element illustrated in FIG. 11A. That is, boundary lines B0 and B1 are related to each other as a lower-level layer of the region R. The segments that define the boundary line are related to one another as the lower-level layer of each boundary line in the order corresponding to the positional relationship. For example, for the boundary line B0, the segments are related to one another in the order of segment S0→segment S1→segment S2→segment S3. Further, for each segment, the boundary points that define the segment are related to one another in the order corresponding to the positional relationship. For example, the segment S0, the boundary points are related to one another in the order of boundary point P0→boundary point P1→boundary point P2→ . . . .

As illustrated in FIGS. 10 and 11, because the positional relationship among the points constituting the object is structurally defined in both the CAD data and the three-dimensional model data, the three-dimensional model data can be produced by performing structural analysis to the CAD data 252a. In the CAD data 252a that is of the design data, the structure of the object (workpiece) is defined as the set of first elements (triangular patches) that are partitioned from each other by the boundary line and/or the set of second elements (planes) including one or plural first elements. Accordingly, the producing module 260 produces the three-dimensional model data from the outline of the object (workpiece) based on the information on the first element and/or second element included in the CAD data 252a.

Specifically, the producing module 260 hierarchically defines the boundary between the second element including one or plural first elements defined by the received design data (CAD data 252a) and another second element adjacent to the second element, thereby producing the three-dimensional model data.

More particularly, when the definition of plane illustrated in FIG. 10B does not exist in the CAD data 252a, the producing module 260 determines the normal vectors with respect to the plural triangular patches defined in FIG. 10A, and the producing module 260 summarizes the adjacent triangular patches (first elements), which have the normal vectors whose directions are identical or fall within a predetermined angle range, as the second element constituting the same plane, thereby producing the definition of plane. Obviously the procedure is omitted when the definition of plane exists in the CAD data 252a. The segment that is of the connection of the plural boundary points constituting the plane is produced from the definitions of planes. Then the boundary line data is produced as the boundary between the planes adjacent to each other. As described above, the three-dimensional model data including the pieces of hierarchical data of the boundary line, segment, and boundary point are produced in order to hierarchically define the boundary.

The model producing apparatus 200 according to one or more embodiments of the present invention converts the CAD data to produce the three-dimensional model data, which allows the improvement of usability. That is, the model producing apparatus 200 can relieve the user the trouble of producing the three-dimensional model data and prevent the quality of the produced three-dimensional model data from depending largely on the user's experience <H. User Support Functions in Producing Three-dimensional Model Data>

User support functions which support the user to producing the three-dimensional model data with the model producing apparatus 200 according to one or more embodiments of the present will be described below.

(h1. Display Function)

Figure 12:
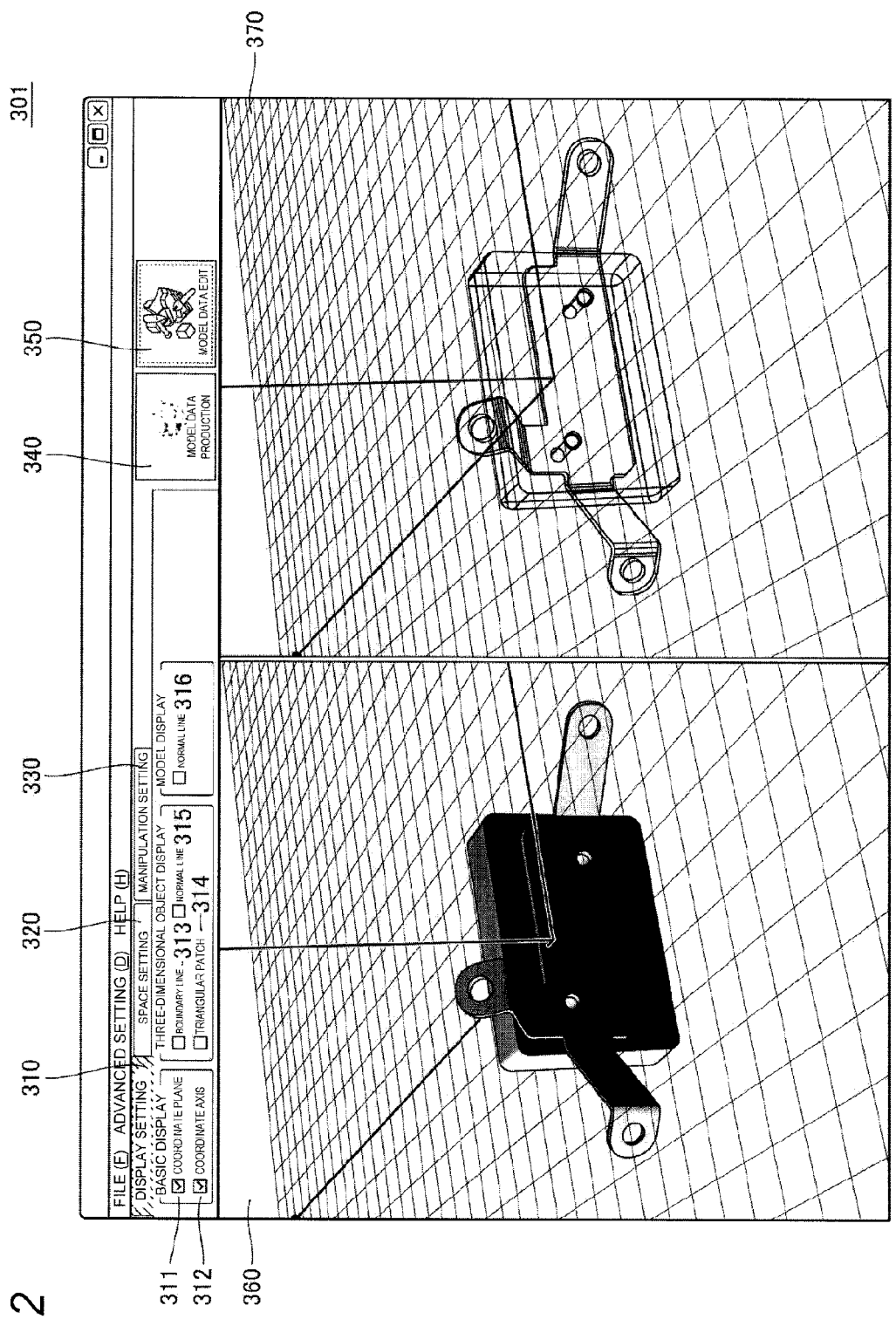
FIG. 12 is a view illustrating an example of a user interface screen provided in the model producing apparatus of an embodiment of the present invention.
Figure 13:
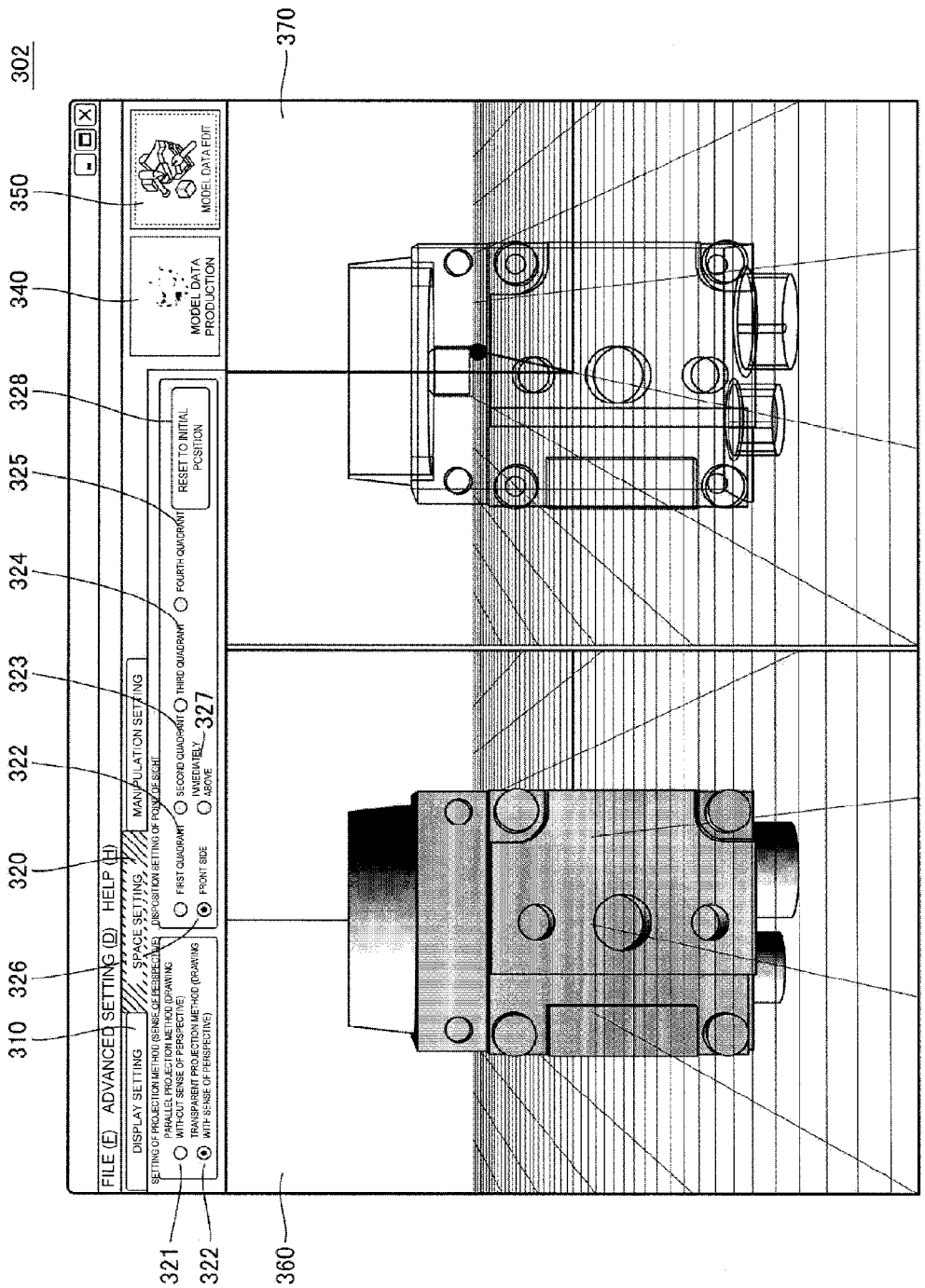
FIG. 13 is a view illustrating an example of the user interface screen provided in the model producing apparatus of an embodiment of the present invention.

The model producing apparatus 200 according to one or more embodiments of the present invention converts the CAD data to produce the three-dimensional model data. FIGS. 12 and 13 are views illustrating an example of the user interface screen provided in the model producing apparatus 200 according to one or more embodiments of the present invention. The display module 278 (FIG. 9) mainly provides the user interface screen.

As illustrated in FIG. 12, the model producing apparatus 200 provides a user interface screen 301 on which contents (described object) of the CAD data of the conversion target and the three-dimensional model data produced by the conversion can be compared to each other. The user can compare the states before and after the conversion processing by displaying the object defined by the CAD data and the produced three-dimensional model data side by side, whereby the user can easily evaluate the correctness or adequateness of the conversion. That is, the display module 278 sterically displays the object (workpiece) defined by the CAD data (design data) and the three-dimensional model data defined by the produced three-dimensional model data side by side.

More specifically, a user interface screen 301 includes a button 340 that is used to issue an instruction to convert the CAD data and a button 350 that is used to edit the three-dimensional model data produced by the conversion. When the user selects the button 340 to select the CAD data of the conversion target, the conversion processing is performed to display the three-dimensional model data illustrated in FIG. 12.

The user interface screen 301 also includes an object display area 360 where the three-dimensional object defined by the CAD data of the conversion target is displayed and a model display area 370 where the three-dimensional model obtained by the conversion processing is displayed. The three-dimensional object displayed in the object display area 360 is typically so-called solid display. On the other hand, the three-dimensional object displayed in the model display area 370 is line-drawing display expressing the outline.

A display setting tab 310, a space setting tab 320, and a manipulation setting tab 330 are prepared in the user interface screen 301 such that the user can freely change display contents in the object display area 360 and model display area 370. FIG. 12 illustrates the state in which the display setting tab 310 is selected.

The display setting tab 31G includes items of "basic display", "three-dimensional object display", and "model display".

The "basic display" includes checkboxes that are used to set validation/invalidation of pieces of information additionally displayed in the object display area 360 and model display area 370. When a checkbox 311 of "coordinate plane" is selected, mesh display corresponding to the three-dimensional coordinate is validated. When a checkbox 312 of "coordinate axis" is selected, display of the coordinate axis of the three-dimensional coordinate is validated. FIG. 12 illustrates the state in which the display is validated for each piece of information.

The "three-dimensional object display" includes the checkboxes that are used to set the validation/invalidation of the pieces of information additionally displayed in the object display area 360. When a checkbox 313 of "boundary line" is selected, display of the boundary line (indicating a range of each plane) of the object defined by the CAD data is validated. When a checkbox 314 of "triangular patch" is selected, display with respect to each triangular patch constituting the object defined by the CAD data is validated. When a checkbox 315 of "normal line" is selected, display of the normal line of each plane constituting the object defined by the CAD data is validated.

The "model display" includes the checkbox that is used to set the validation/invalidation of the information additionally displayed in the model display area 370. When a checkbox 316 of "normal line" is selected, display of the normal line with respect to the segment included in the three-dimensional model data.

A drawing method and a point of sight can also be changed for the three-dimensional object and three-dimensional model data. Therefore, the user can check contents of the three-dimensionally-defined object and model defined from plural points of sight.

A user interface screen 302 illustrated in FIG. 13 corresponds to the state in which the space setting tab 320 is selected. The space setting tab 320 includes items of "setting of projection method (sense of perspective)" and "disposition setting of point of sight".

The "setting of projection method (sense of perspective)" includes radio buttons that are used to select the drawing method in the object display area 360 and model display area 370. When a radio button 321 of "parallel projection method (drawing without sense of perspective)" is selected, the object and the model are drawn in a planar manner in the object display area 360 and model display area 370. On the other hand, when a radio button 322 of "perspective projection method (drawing with sense of perspective)" is selected, the object and the model are sterically drawn in the object display area 360 and model display area 370 as illustrated in FIG. 13. The user can intuitively recognize the states of the object and model by performing the drawing with the sense of perspective.

The "disposition setting of point of sight" includes radio buttons 322 to 327 used to select the point of sight that becomes a reference of the drawing in the object display area 360 and the model display area 370. When one of the radio buttons 322 to 325 of "first quadrant", "second quadrant", "third quadrant", and "fourth quadrant" is selected, the state is seen in the object display area 360 and model display area 370 in disposing the point of sight in the corresponding quadrant on the three-dimensional coordinate. When the radio button 326 of "front side" or the radio button 327 of "immediately above" is selected, the state is seen in disposing the point of sight in front of or immediately above the object.

When the button of "reset to initial position" is selected, the drawing is returned to the initial state.

(h2. Free Edit Function)

The model producing apparatus 200 according to one or more embodiments of the present invention provides the function in which the user freely edits the three-dimensional model data in order to improve the processing rate and recognition accuracy of the three-dimensional recognition processing. Specifically, the producing module 260 (FIG. 9) that is of the free edit function 262 updates the three-dimensional model data in response to the instruction from the outside (typically from the user) while the object (object) defined by the design data (CAD data 262a) and the three-dimensional model are sterically displayed side by side.

Figure 15:
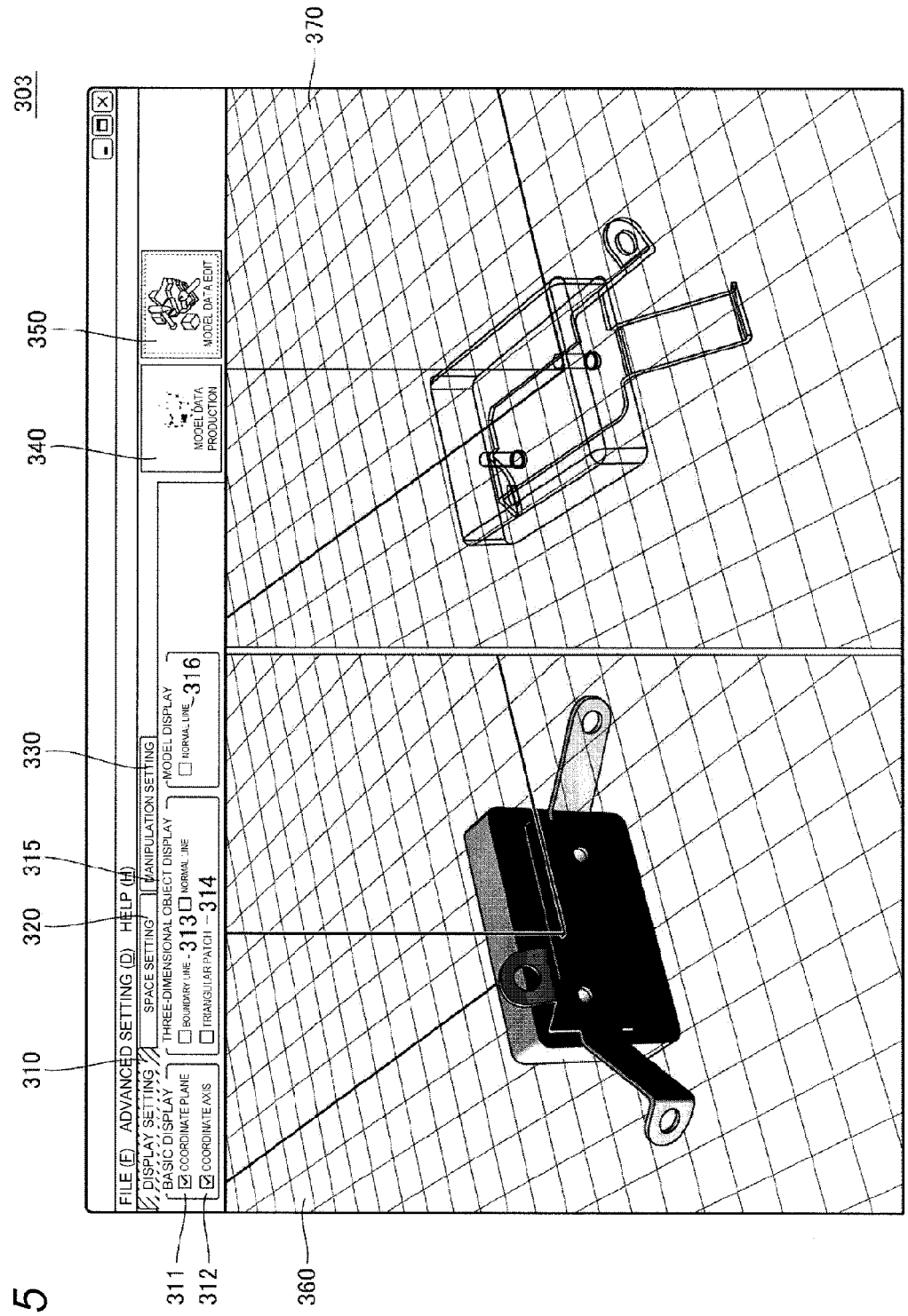
FIG. 15 is a view illustrating an example of the user interface screen provided in the model producing apparatus of an embodiment of the present invention.

FIG. 14 is a view for explaining a free edit function provided in the model producing apparatus 200 according to one or more embodiments of the present invention. FIG. 15 is a view illustrating an example of the user interface screen provided in the model producing apparatus 200 according to one or more embodiments of the present invention.

[h2-1]: Validation/Invalidation of Three-Dimensional Model Element

The model producing apparatus 200 can set validation/invalidation of the three-dimensional model data in the three-dimensional recognition processing with respect to an arbitrary segment and/or boundary line in the three-dimensional model data that is produced by the conversion of the CAD data. More specifically, as illustrated in FIG. 14A, when referring to the three-dimensional object displayed in the object display area 360, the user can invalidate a portion that is not likely necessary in the portion (segment or boundary line) constituting the three-dimensional model data displayed in the model display area 370.

A flag indicating whether the portion is valid as the three-dimensional model data is provided in the data structure illustrated in FIG. 11B while correlated with the segment or boundary line. When the user performs the manipulation illustrated in FIG. 14A, a value of the flag provided to the segment or boundary line correlated to the designated portion is changed from a value indicating the "validation" to a value indicating the "invalidation". Therefore, even if the user determines that the portion is invalid, the user can change the portion to the "validation" in an ex-post manner. That is, the user can reversibly edit the three-dimensional model data.

[h2-2]: Change of Position and Posture

Basically the pieces of information on the position and posture of the three-dimensional object defined by the CAD data are taken over in the three-dimensional model data that is produced by the conversion of the CAD data. However, occasionally the user wants to confirm the three-dimensional model in the position or posture that is different from the position or posture of the three-dimensional object defined by the CAD data. In order to meet the needs, in the model producing apparatus 200 according to one or more embodiments of the present invention, the position and posture of the produced three-dimensional model can be changed independently of the CAD data of the conversion target.

That is, as illustrated in FIG. 14B, the user can arbitrarily change the position and posture of the three-dimensional model by performing the mouse manipulation or the like to the produced three-dimensional model data. At this point, the position and posture of the three-dimensional object displayed in the object display area 360 are maintained in the original state.

FIG. 15 illustrates a processing example when the user performs the free edit function. In a user interface screen 303 illustrated in FIG. 15, the three-dimensional object displayed in the object display area 360 is partially invalidated, and the three-dimensional model whose position and posture are changed is displayed in the model display area 370.

(h3. Unnecessary Region Removing Function)

In the manipulation of the free edit function, the user freely edits the three-dimensional model data to improve the processing rate and recognition accuracy of the three-dimensional recognition processing. Alternatively, an unnecessary region (component or shape) that is not used in the three-dimensional recognition processing may be removed based on the three-dimensional model data that is previously set by the user.

Specifically, the producing module 260 (FIG. 9) that is of the unnecessary region removing function 264 extracts the element satisfying a predetermined producing condition in the first element (triangular patch) and second element (plane) which are included in the CAD data (design data), and the producing module 260 produces the three-dimensional model data from the extracted element. The unnecessary region removing function will be described below.

Figure 16:
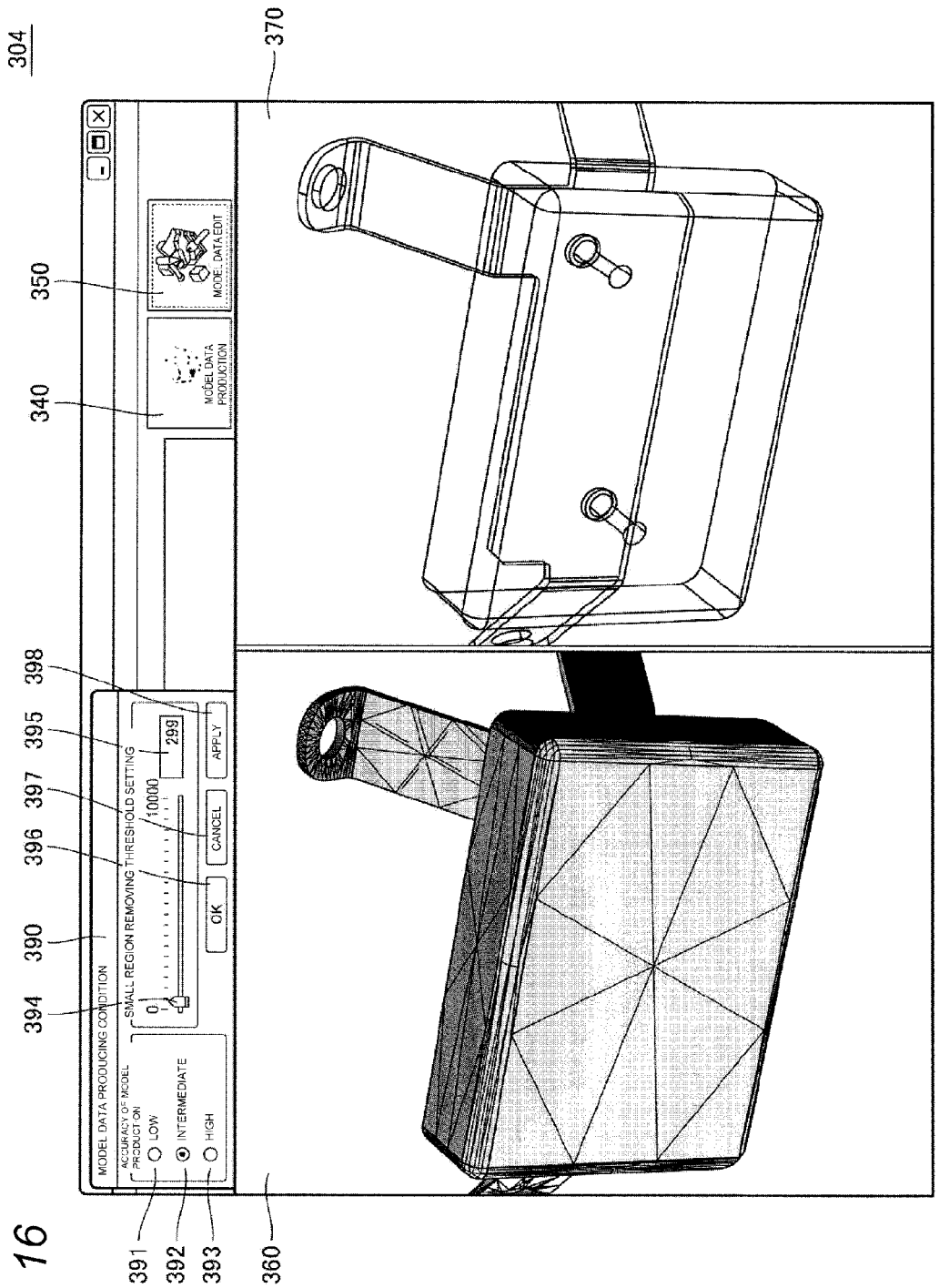
FIG. 16 is a view illustrating an example of the user interface screen provided in the model producing apparatus of an embodiment of the present invention.
Figure 17:
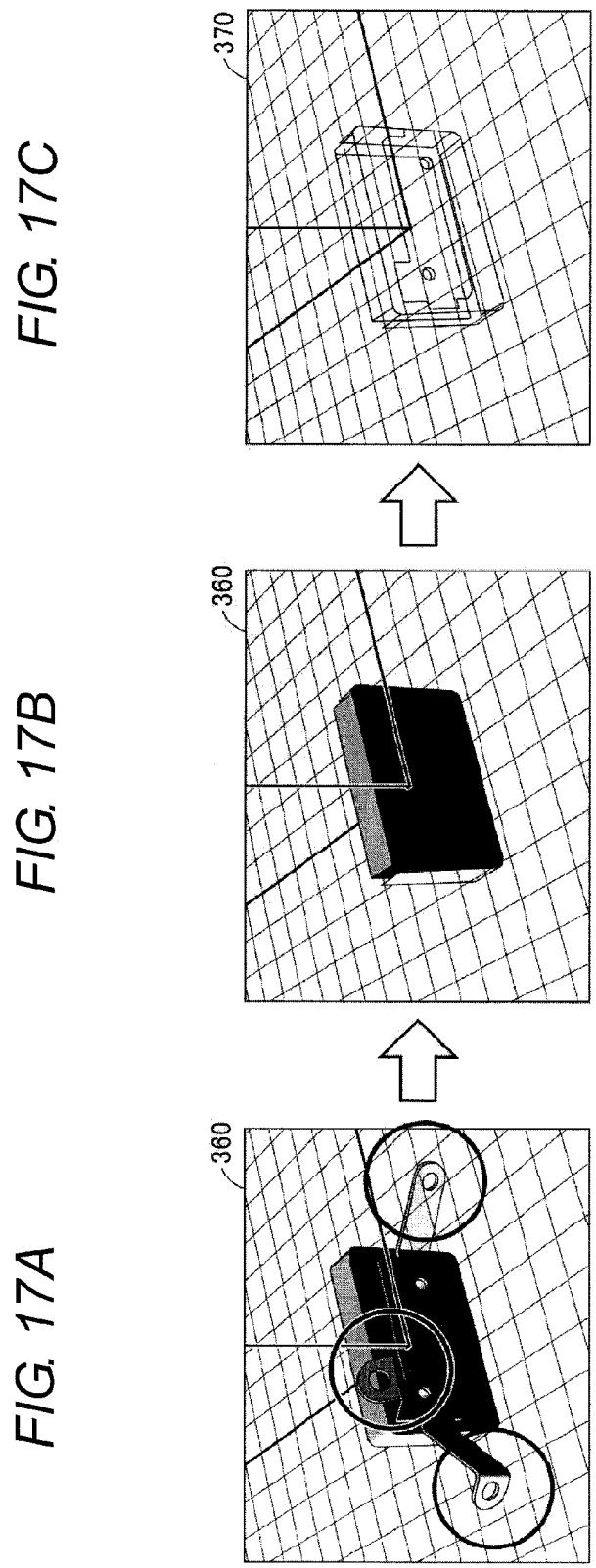
FIG. 17 is a view for explaining one piece of processing included in a unnecessary region removing function provided in the model producing apparatus of an embodiment of the present invention.
Figure 18:
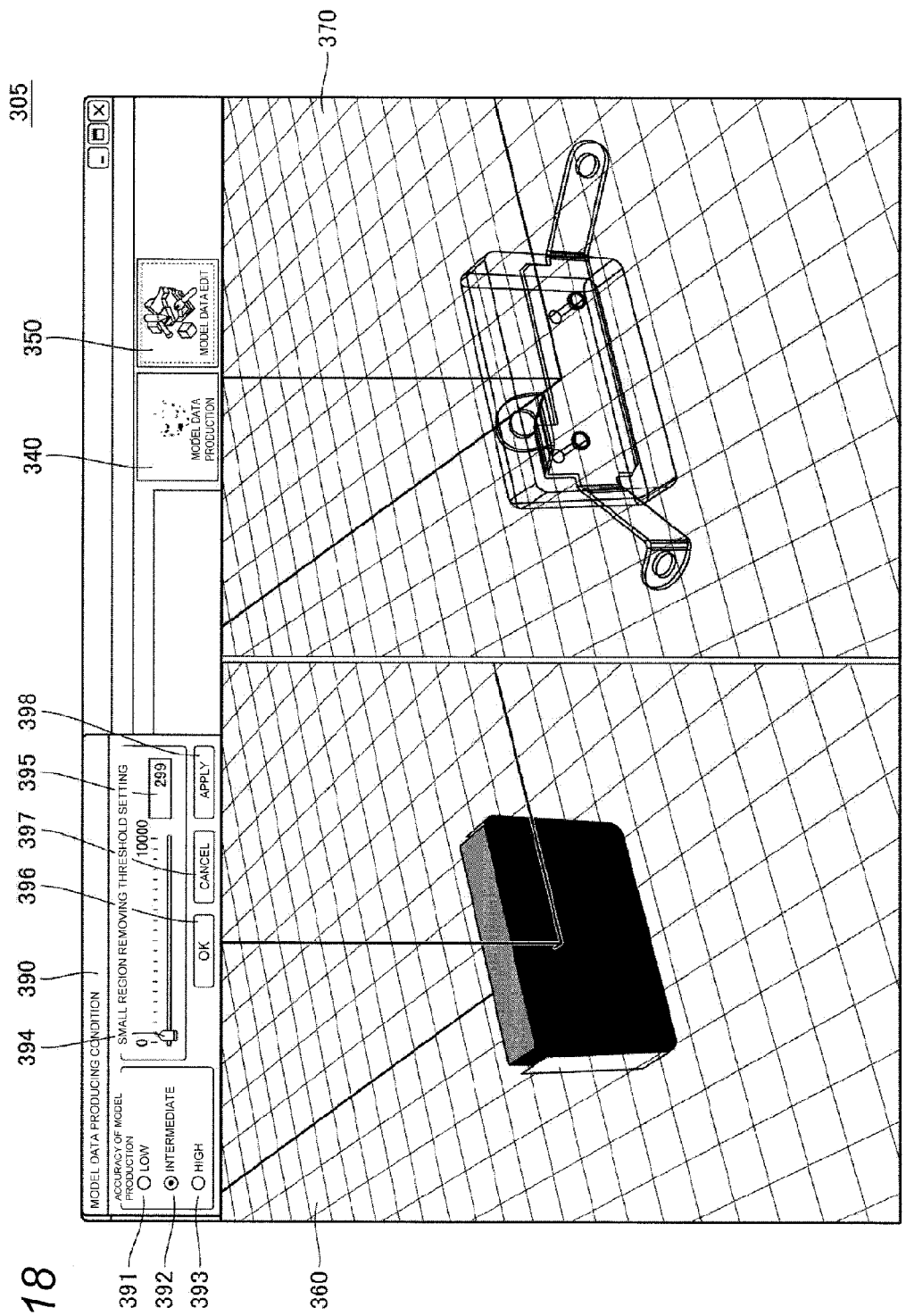
FIG. 18 is a view illustrating an example of the user interface screen provided in the model producing apparatus of an embodiment of the present invention.

FIGS. 16 and 18 are views illustrating an example of the user interface screen provided in the model producing apparatus 200 according to one or more embodiments of the present invention. FIG. 17 is a view for explaining one piece of processing included in an unnecessary region removing function provided in the model producing apparatus 200 according to one or more embodiments of the present invention.

[h3-1]: Triangular Patch Condition

In the model producing apparatus 200, when the user sets a condition to each triangular patch constituting the three-dimensional object included in the CAD data, the three-dimensional model data is produced based on the triangular patch satisfying the condition. More specifically, the producing module 260 includes a threshold for the area of the first element (triangular patch) included in the CAD data (design data), and the producing module 260 removes the element, which is smaller than the threshold about area designated by the producing condition, from the producing target of the three-dimensional model data.

A dialog 390 is displayed in a user interface screen 304 illustrated in FIG. 16 in order to input the condition that produces the three-dimensional model data. The dialog 390 includes items of "accuracy of model production" and "small region removing threshold setting".

The "accuracy of model production" includes radio buttons 391, 392, and 393 in order to set production accuracy of the three-dimensional model data. When one of the radio buttons 391, 392, and 393 of "low", "intermediate", and "high", the three-dimensional model data is produced using the triangular patch satisfying the condition corresponding to the selected accuracy.

When the radio button 391 of "low" is selected, the triangular patch having the relatively small area is not reflected on the three-dimensional model data. More specifically, the triangular patch having the relatively small area is dealt with as a part of the triangular patch adjacent to the triangular patch. On the other hand, when the radio button 393 of "high" is selected, the triangular patch having the relatively small area is also reflected on the three-dimensional model data.

The "small region removing threshold setting" includes a slide bar 394 in order to set an extraction condition (threshold of the area of the triangular patch) of the triangular patch used to produce the three-dimensional model data. A threshold that the user manipulates the slide bar 394 to set is numerically displayed in a display box 395. The threshold set by the slide bar 394 is validated by selecting a button 396 of "OK" or a button 398 "apply". When a button 397 of "cancel" is selected, the set threshold is cancelled.

The model producing apparatus 200 performs the structural analysis of the CAD data to compare the area of each triangular patch constituting the three-dimensional object to the set threshold. The triangular patch having the area smaller than the set threshold is not used to produce the three-dimensional model data.

Thus, in the triangular patches constituting the three-dimensional object included in the CAD data, only the triangular patch satisfying the condition to produce the three-dimensional model data based on the threshold levels (low, intermediate, and high levels) of the previously-set area or the specific threshold condition designated by the user.

Therefore, compared with the case in which the user edits the produced three-dimensional model data, the three-dimensional model data can be produced more properly with a smaller workload. The processing rate and recognition accuracy of the three-dimensional recognition processing can be improved.

[h3-2]: Geometric Shape Condition

As described above, the condition can be set based on the area of the triangular patch. Alternatively, a specific geometric shape is previously set, and a portion corresponding to the geometric shape may be removed from the producing target of the three-dimensional model data. That is, the producing target of the three-dimensional model data includes information indicating the specific geometric shape included in the CAD data (design data), and the producing module 260 removes the portion corresponding to the specific geometric shape from the producing target of the three-dimensional model data.

For a typical usage pattern, frequently the design is performed on the CAD data such that one workpiece is formed by combining plural components, and the shape of each component is individually defined. In such cases, the user previously sets information (geometric shape) on the component that should be removed from the producing target of the three-dimensional model data, whereby the component corresponding to the set geometric shape is not reflected on the three-dimensional model data.

As illustrated in FIG. 17A, it is assumed that three additional components are assembled in a main body of a certain workpiece, and it is assumed that the three additional components are previously designated as the component to be removed. The model producing apparatus 200 removes pieces of design information on the components in pieces of design information included in the CAD data. That is, the model producing apparatus 200 regards the workpiece as the workpiece illustrated in FIG. 17B, and the model producing apparatus 200 produces the three-dimensional model data illustrated in FIG. 17C from the workpiece in which the components are removed.

For the method in which the user designates the component to be removed, the component to be removed is directly designated on CAD application, and the designated information may be transferred to the model producing processing performed by the model producing apparatus 200. Alternatively, information on the geometric shape indicating the component to be removed may be acquired from an external file. Alternatively, the user may directly designate the component to be removed with respect to the three-dimensional object displayed in the object display area 360.

At this point, as illustrated in FIG. 18, according to one or more embodiments of the present invention, the removed portion is designated with respect to the three-dimensional object displayed in the object display area 360 while the three-dimensional object is compared to the three-dimensional model displayed in the model display area 370.

[h3-3]: Camera Resolution Condition

Because the three-dimensional recognition processing is applied to the image data imaged with the stereo camera 1, according to one or more embodiments of the present invention, the accuracy of the three-dimensional model data used in the three-dimensional recognition processing is determined according to visual field resolution of the stereo camera 1. That is because a portion finer than the visual field resolution of the stereo camera 1 cannot be recognized with the stereo camera 1.

Therefore, in the model producing apparatus 200 according to one or more embodiments of the present invention, the portion finer than the visual field resolution in the CAD data is not reflected on the three-dimensional model data based on the information on the visual field resolution of the stereo camera 1.

More specifically, a threshold of the area of the single triangular patch or the area of a certain plane that is of the set of plural triangular patches is computed based on the visual field resolution of the stereo camera 1, and the triangular patch or plane having the area smaller than the threshold is not used in the conversion into the three-dimensional model data. The visual field resolution is a real size corresponding to each pixel.

Thus, the processing rate and recognition accuracy of the three-dimensional recognition processing can be improved by applying the condition corresponding to the visual field resolution of the stereo camera 1.

(h4. Complete Hidden-Line Removing Function)

When the three-dimensional model data is produced from the CAD data, occasionally an internal structure of the object (workpiece) is also output as the outline. However, because the internal structure is not a portion that is exposed to the outside of the object, any posture cannot be imaged with the stereo camera 1. The outline of the internal structure is also referred to as a complete hidden-line.

Figure 19:
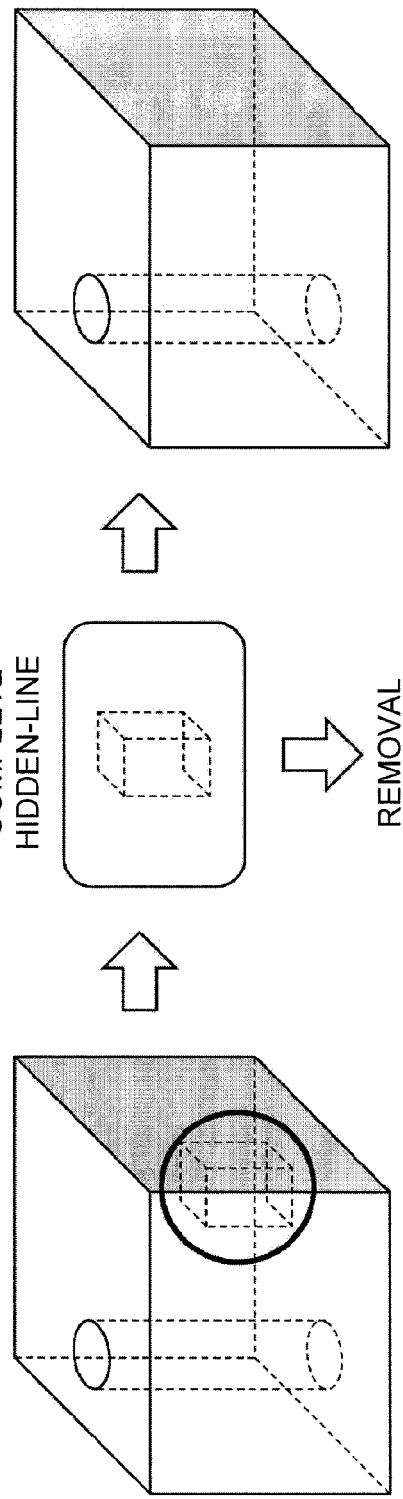
FIG. 19 is a view for explaining a complete hidden-line removing function provided in the model producing apparatus of an embodiment of the present invention.
Figure 20:
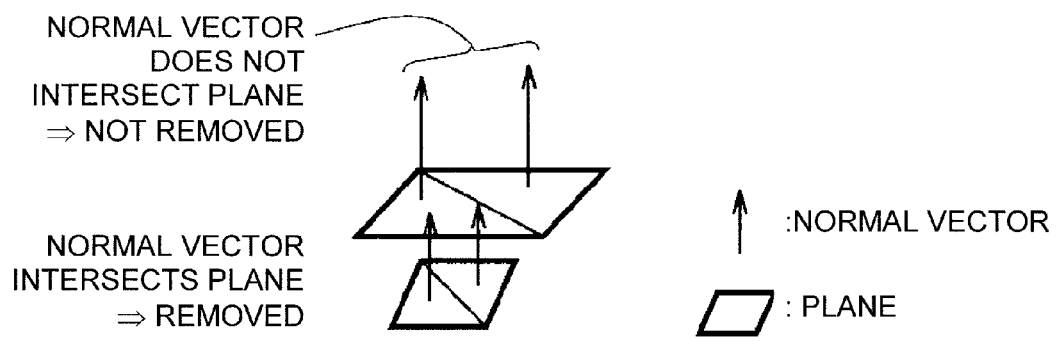
FIG. 20 is a view for explaining one method for realizing the complete hidden-line removing function illustrated in FIG. 19.

FIG. 19 is a view for explaining a complete hidden-line removing function provided in the model producing apparatus 200 according to one or more embodiments of the present invention. FIG. 20 is a view for explaining one method for realizing the complete hidden-line removing function illustrated in FIG. 19.

The model producing apparatus 200 removes the complete hidden-line that is not used in the three-dimensional recognition processing. That is, the plane whose normal line intersects another plane is extracted in the planes defined by the CAD data using information on the normal vector of the second element (plane) that defines the workpiece in the CAD data (design data), the extracted plane is regarded as the portion that is not visually recognized from the outside of the workpiece, and the extracted plane is removed from the producing target of the three-dimensional model data.

For example, it is assumed that a cubic internal structure is included in a three-dimensional object illustrated in FIG. 19. The stereo camera 1 cannot image any posture of the cubic internal structure. Therefore, the internal structure is determined to be the complete hidden-line, and the internal structure is removed from the producing target of the three-dimensional model data. As a result, the produced three-dimensional model data corresponds to a three-dimensional object illustrated on the right of FIG. 19.

According to one or more embodiments of the present invention, evaluation of the point at which the normal line of the plane or triangular patch intersects is adopted as a method for determining which is the complete hidden-line (internal structure) in the portions defined by the CAD data.

Specifically, normal vectors of the planes constituting the object defined by the CAD data are sequentially evaluated as illustrated in FIG. 20. In extending the normal vector of a certain plane, the determination that the plane is located outside the object is made when the normal vector does not intersect another plane. On the other hand, in extending the normal vector of a certain plane, the determination that the plane is located inside the object is made when the normal vector intersects another plane. Therefore, the plane whose normal vector intersects another plane is removed from the producing target of the three-dimensional model data.

The information on the normal vector can directly be used when the information on the normal vector exists with respect to each plane constituting the object. On the other hand, when the information on the normal vector exists with respect to not units of planes of the object but each of the plural triangular patches constituting the plane, an average value of the normal vectors of the triangular patches constituting a certain plane can be set to the normal vector of the plane. Alternatively, the intersection determination is made with respect to all the normal vectors of the triangular patches, a determination whether a certain plane is the complete hidden-line may be made based on a ratio of the triangular patch intersecting another plane to the triangular patches constituting a certain plane.

According to one or more embodiments of the present invention, the normal line is set so as to be oriented toward the outside of the object. Alternatively, a determination whether the orientation of the normal line is incorrect is previously made, and the orientation of the incorrect normal line may be inverted.

Thus, the information that is not used in the three-dimensional recognition processing is not included in the three-dimensional model data, so that the processing rate and recognition accuracy of the three-dimensional recognition processing can be improved.

(h5. Recognition Result Feedback Function)

The three-dimensional model data may be edited based on the recognition result, which is obtained such that the three-dimensional model data produced through the processing is applied to really perform the three-dimensional recognition processing. Recognition rate and recognition performance of the three-dimensional recognition processing can be optimized by feedback of the real recognition result.

The model producing apparatus 200 displays the recognition result, which is obtained by performing the three-dimensional recognition processing using the produced three-dimensional model data, while correlating the recognition result with the three-dimensional model, and the model producing apparatus 200 receives the change to the three-dimensional model data in response to the edit manipulation of the three-dimensional model that is displayed while correlated with the recognition result.

Figure 21:
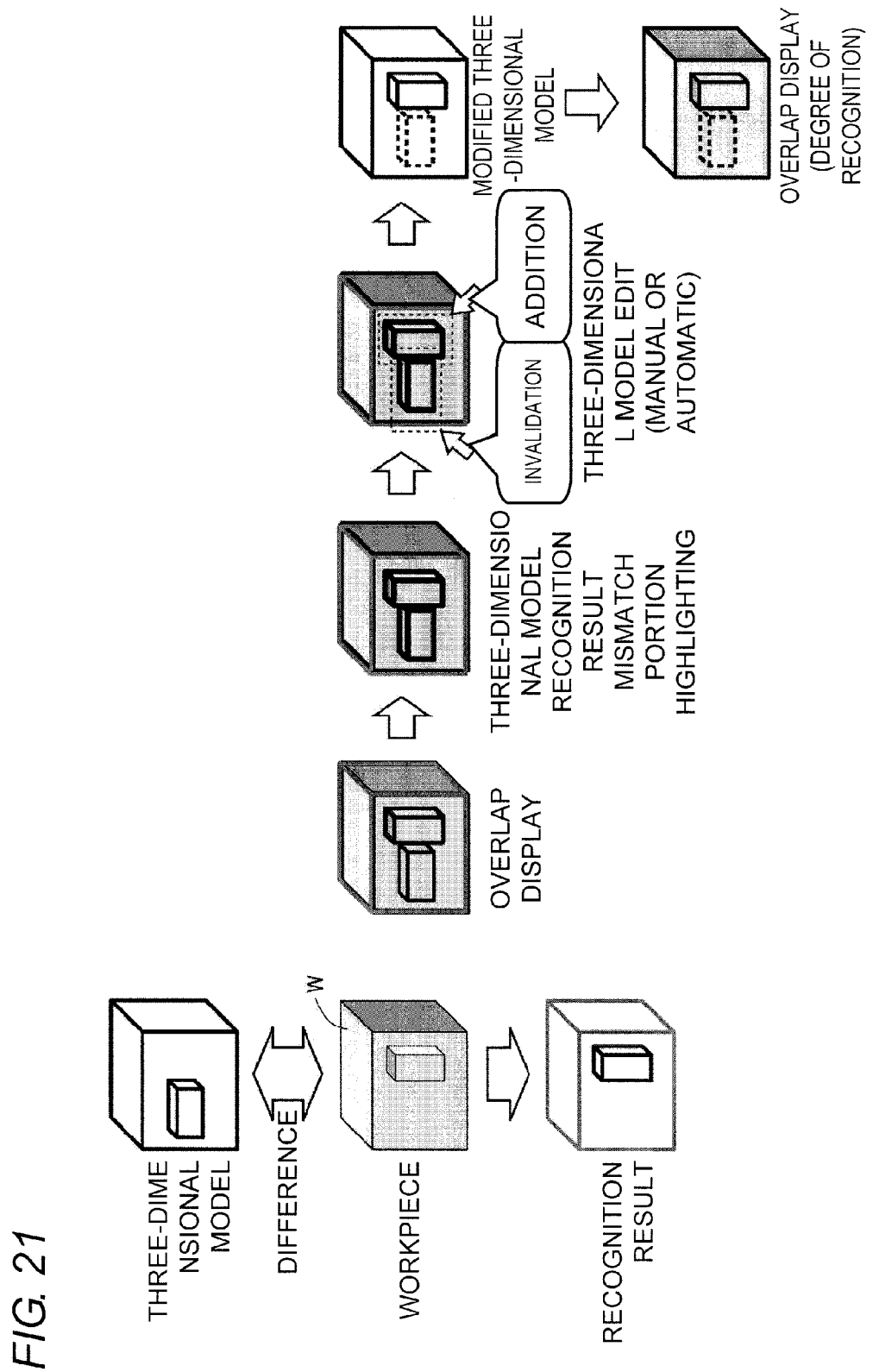
FIG. 21 is a view for explaining a recognition result feedback function provided in the model producing apparatus of an embodiment of the present invention.

FIG. 21 is a view for explaining a recognition result feedback function provided in the model producing apparatus 200 according to one or more embodiments of the present invention.

Referring to FIG. 21, the workpiece imaged with the stereo camera 1, the three-dimensional model data used in the three-dimensional recognition processing, and the recognition result of the three-dimensional recognition processing performed using the three-dimensional model data are overlap-displayed (superimposed) in the recognition result feedback function according to one or more embodiments of the present invention. The user can understand the state of the workpiece imaged really with the stereo camera 1 and the state of the recognition result of the three-dimensional recognition processing with respect to the three-dimensional model data by the overlap display.

The three-dimensional model data is not matched with the recognition result, when the CAD data used to produce the three-dimensional model data is not matched with the shape of the actual workpiece due to the design change of the workpiece. Therefore, a mismatch portion between the three-dimensional model and the recognition result may be highlighted in the overlap display. FIG. 21 illustrates an example in which the workpiece differs from the three-dimensional model in the shape and position of the component disposed on the front side.

When the three-dimensional model data is adjusted, it is necessary to invalidate the element that exits in the three-dimensional model data while not existing in the real workpiece. In such cases, the user designates the element that exists only in the three-dimensional model by comparing the three-dimensional model and the recognition result, which allows the element to be invalidated. Alternatively, the model producing apparatus 200 may automatically invalidate the mismatch portion between the three-dimensional model and the recognition result.

On the other hand, it is necessary to add the element that exists in the real workpiece while not existing in the three-dimensional model to the three-dimensional model data. In such cases, the user can manually input the element (primitive graphic) that does not exist in the three-dimensional model by comparing the three-dimensional model and the recognition result. Alternatively, the model producing apparatus 200 automatically add the element that does not exist in the three-dimensional model that is obtained by a difference between the three-dimensional model and the recognition result.

As illustrated in FIG. 21, the three-dimensional model modified through the processing may be displayed such that the user can confirm the three-dimensional model.

Further, a degree of coincidence (degree of recognition) of the recognition result to the set three-dimensional model may graphically be displayed (the overlap display of the degree of recognition illustrated in FIG. 21). Therefore, the user can specify the segment having the higher probability of being recognized in the segments constituting the three-dimensional model data. Therefore, the specific segment (component or shape) constituting the three-dimensional model data may be weighted such that the influence on the recognition result is strengthened or weakened.

For example, in the plural segments included in the three-dimensional model data, the segment having the high degree of importance and the segment having the low degree of importance are distinguished from each other. When the segment having the high degree of importance is successfully recognized, the determination that the recognition is successfully performed can be made as a whole even if the recognition ends in failure with respect to the segment having the low degree of importance.

(h6. Simulation Information Reflecting Function)

In the user interface screens illustrated in FIGS. 12 and 13, the object displayed in the object display area 360 is drawn under the predetermined condition. On the other hand, the more realistic three-dimensional model data can be produced by displaying the object on which the real imaging conditions (such as a surface color of the workpiece, the lighting condition, a state of generated shadow, and a background color) of the stereo camera 1 are reflected.

That is, the model producing apparatus 200 has the function of simulating the state in which the workpiece defined by the CAD data is visually recognized according to the instructed imaging condition, and the three-dimensional model defined by the produced three-dimensional model data and the workpiece obtained by the simulation function are displayed side by side such that the workpiece obtained by the simulation function is visually recognized. At this point, the model producing apparatus 200 receives the edit of the three-dimensional model data.

Figure 22B:
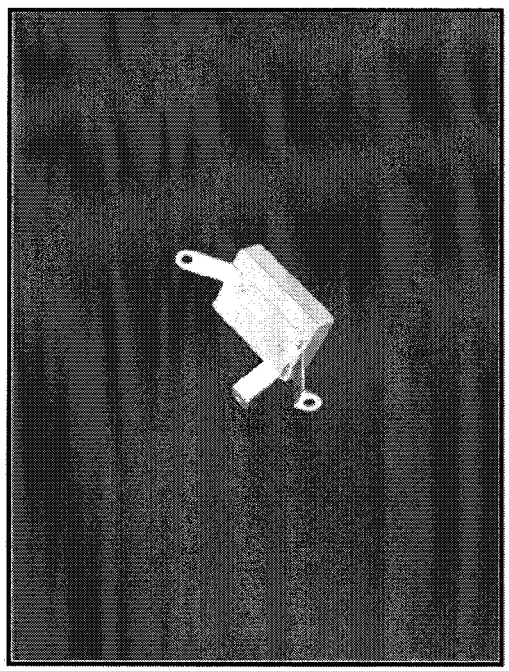
FIG. 22 is a view illustrating a simulation example in a simulation information reflecting function provided in the model producing apparatus of an embodiment of the present invention.

FIG. 22 is a view illustrating a simulation example in a simulation information reflecting function provided in the model producing apparatus 200 according to one or more embodiments of the present invention. FIG. 23 is a view for explaining an effect of the simulation information reflecting function provided in the model producing apparatus 200 according to one or more embodiments of the present invention.

Figure 22A:
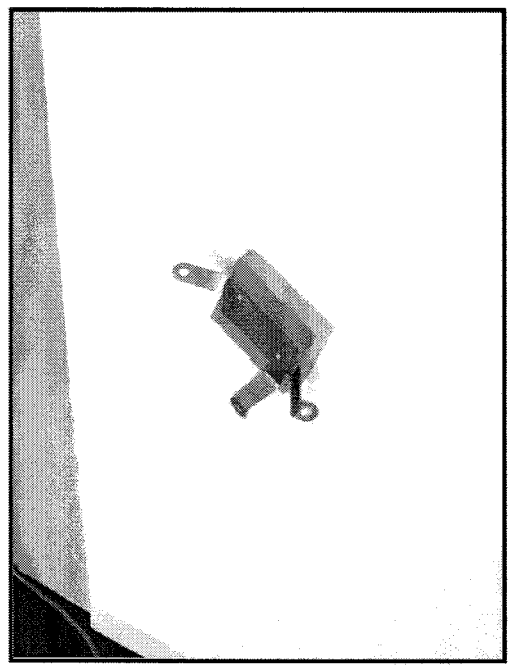
Figure 23:
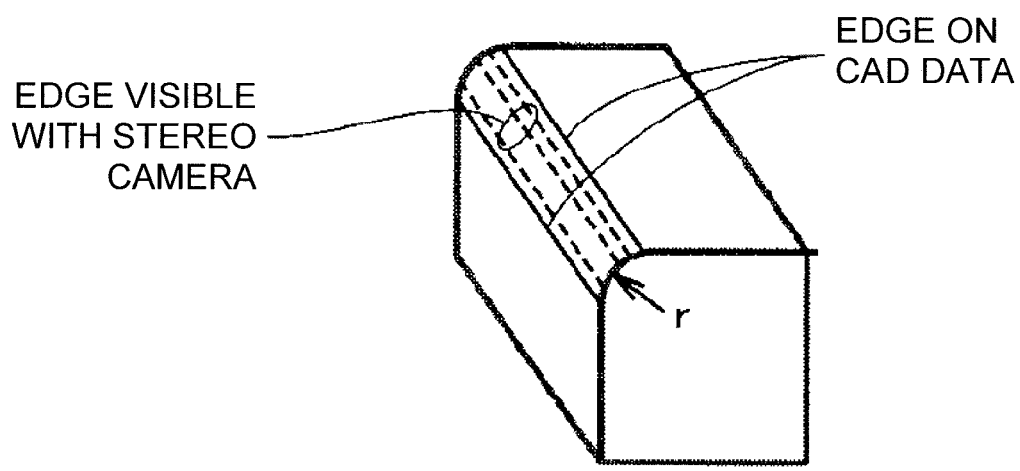
FIG. 23 is a view for explaining an effect of the simulation information reflecting function provided in the model producing apparatus of an embodiment of the present invention.

FIG. 22A illustrates the result in which the workpiece W is imaged with the stereo camera 1 under a certain imaging condition. As illustrated in FIG. 22A, the vision of the workpiece W varies possibly depending on a difference between the surface color of the workpiece W and the background color, the position and orientation of the lighting, and the like. Therefore, the vision is simulated with respect to the CAD data based on the imaging condition to estimate the state of the real workpiece W that is visually recognized with the stereo camera 1. FIG. 22B illustrates an example of the simulation result under a certain imaging condition.

The simulation result is displayed in the object display area 360 (for example, see FIGS. 12 and 13) on the user interface screen to predict the outline (edge portion in the image) that emerges in the image obtained by the real imaging, which allows the three-dimensional model data to be produced.

For example, the three-dimensional model data is produced in consideration of the image obtained by the simulation, which allows the outline of a chamfered portion or the like to be properly reflected on the three-dimensional model data. As illustrated in FIG. 23, assuming that the shape includes the chamfered portion, the chamfered portion having a radius r is defined as the set of plural triangular patches (or planes) on the CAD data. Therefore, on the CAD data, the plural boundary lines emerge on the surface of the chamfered portion. However, it is believed that one outline (edge portion) located on the chamfered portion is really visually recognized with the stereo camera 1. Therefore, the outline of the chamfered portion can be optimized (unified) in the three-dimensional model data by contrasting the three-dimensional model data with the image obtained by the simulation.

Thus, the simulation result is displayed under the real imaging condition to modify the three-dimensional model data, which allows the improvement of the processing rate and recognition accuracy of the three-dimensional recognition processing.

<I. Entire Processing Procedure>

Figure 24:
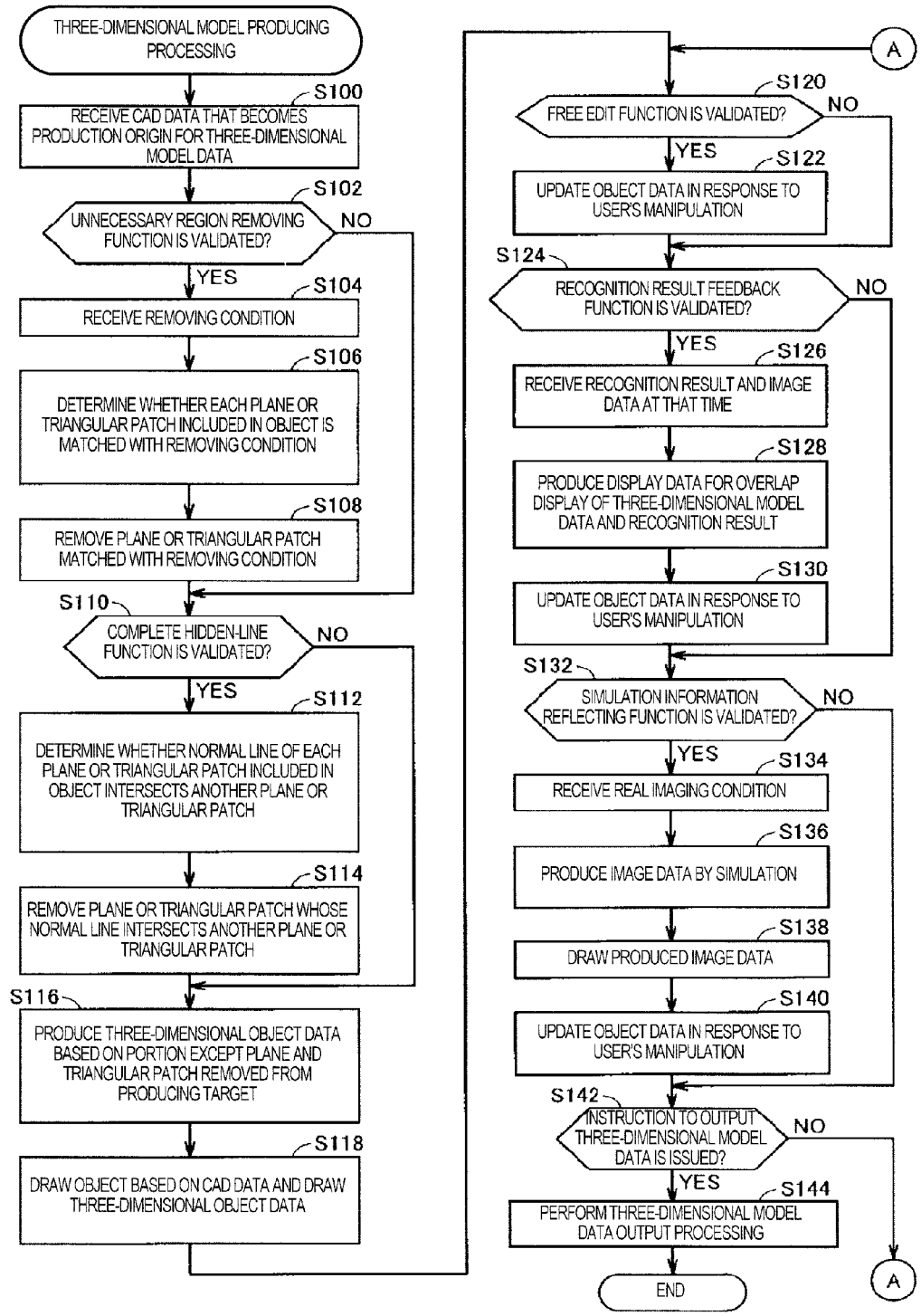
FIG. 24 is a flowchart illustrating a procedure of three-dimensional model data producing processing performed by the model producing apparatus of an embodiment of the present invention.

FIG. 24 is a flowchart illustrating a procedure of three-dimensional model data producing processing performed by the model producing apparatus 200 according to one or more embodiments of the present invention. Each step illustrated in FIG. 24 is realized by sequentially executing the program (code/command set) retained in the fixed disk 207 or memory 206 by the CPU 205 illustrated in FIG. 8.

Referring to FIG. 24, the CPU 205 receives the CAD data that becomes a production origin for the three-dimensional model data (Step S100).

The CPU 205 determines whether the unnecessary region removing function is validated (Step S102). When the unnecessary region removing function is validated (YES in Step S102), the CPU 205 receives a removing condition that removes from the element reflected on the three-dimensional model data in the object defined by the CAD data (Step S104). The CPU 205 sequentially determines whether each plane or triangular patch included in the object defined by the CAD data is matched with the removing condition (Step S106). In the object defined by the CAD data, the plane or triangular patch matched with the removing condition is removed from the producing target of the three-dimensional model data (Step S108).

When the unnecessary region removing function is not validated (NO in Step S102) or when the processing in Step S108 is completed, the CPU 205 determines whether the complete hidden-line function is validated (Step S110). When the complete hidden-line removing function is validated (YES in Step S110), the CPU 205 sequentially determines whether the normal line of each plane or triangular patch included in the object defined by the CAD data intersects another plane or triangular patch (Step S112). In the object defined by the CAD data, the plane or triangular patch whose normal line intersects another plane or triangular patch is removed from the producing target of the three-dimensional model data (Step S114).

When the complete hidden-line removing function is not validated (NO in Step S110), or when the processing in Step S114 is completed, the CPU 205 produces the three-dimensional object data based on the portion except the plane and triangular patch removed from the producing target in the object defined by the CAD data (Step S116). The CPU 205 draws the object based on the CAD data, and the CPU 205 draws the three-dimensional object data produced in Step S116 (Step S118).

The CPU 205 determines whether the free edit function is validated (Step S120). When the free edit function is validated (YES in Step S120), the CPU 205 updates the already-produced object data in response to the user's manipulation (Step S122).

When the free edit function is not validated (NO in Step S120), or when the processing in Step S122 is completed, the CPU 205 determines whether the recognition result feedback function is validated (Step S124). When the recognition result feedback function is validated (YES in Step S124), the CPU 205 receives the recognition result of the already-performed three-dimensional recognition processing and the image data used at that time (Step S126). The CPU 205 produces the display data on the image data of the workpiece in order to overlap-display the three-dimensional model data and the recognition result (Step S128). At this point, the CPU 205 also produces additional information on the mismatch portion between the three-dimensional model and the recognition result. Then the CPU 205 updates the already-produced object data in response to the user's manipulation (Step S130).

When the recognition result feedback function is not validated (NO in Step S124), or when the processing in Step S130 is completed, the CPU 205 determines whether the simulation information reflecting function is validated (Step S132). When the simulation information reflecting function is validated (YES in Step S132), the CPU 205 receives the real imaging condition (Step S134). Then the CPU 205 produces the image data indicating the vision of the object defined by the CAD data by the simulation under the imaging condition received in Step S134 (Step S136). Then the, CPU 205 draws the image data produced in Step S136 (Step S138). The CPU 205 updates the already-produced object data in response to the user's manipulation (Step S140).

When the simulation information reflecting function is not validated (NO in Step S132), or when the processing in Step S140 is completed, the CPU 205 determines whether the instruction to output the three-dimensional model data is received (Step S142).

When the instruction to output the three-dimensional model data is not received (YES in Step S142), the pieces of processing from Step S120 are repeated.

On the other hand, when the instruction to output the three-dimensional model data is received (YES in Step S142), the CPU 205 outputs the current three-dimensional model data as the three-dimensional model to the sensor controller and the like (Step S144). Then the three-dimensional model producing processing is ended.

<J. Action and Effect>

Because the model producing apparatus 200 according to one or more embodiments of the present invention directly produces the three-dimensional model data from the CAD data used to design the workpiece, the errors are not accumulated, unlike the case where the workpiece is really imaged to produce the three-dimensional model data. The model producing apparatus 200 according to one or more embodiments of the present invention displays the object defined by the CAD data and the three-dimensional model side by side, so that the edit can arbitrarily performed while the accuracy of the completed three-dimensional model is understood at a glance. Therefore, the user can easily produce the three-dimensional model data used in the three-dimensional recognition processing.

It is understood that the disclosed embodiment is not restrictive but described only by way of example. The scope of the invention is expressed by not the description but claims. It is to be noted that the meaning equivalent to the claims and all the changes within the claims are included in the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A model producing apparatus implemented by at least one of a processor and a hardware circuit, wherein the model producing apparatus produces three-dimensional model data based on CAD data, the three-dimensional model data being used in processing of performing three-dimensional recognition of an object, which acquires three-dimensional information from image data obtained by imaging the object with plural cameras and checks the acquired three-dimensional information against the three-dimensional model data, the CAD data defining the object as a set of three-dimensional coordinate values of a plurality of points of the object, the model producing apparatus comprising:

an input unit for receiving the CAD data in which a structure of the object is defined as a combination of first elements partitioned by a boundary line;

a producing unit for producing the three-dimensional model data by hierarchically defining boundary points of second elements, segments, and boundary lines between the second elements adjacent to each other, each of the second elements including one or a plurality of the first elements that are defined by the received CAD data, each of the segments being formed by joining the respective boundary points, each of the boundary lines between the second elements adjacent to each other being formed by the respective segments; and a display unit for sterically displaying the object defined by the CAD data and a three-dimensional model defined by the produced three-dimensional model data side by side.

2. The model producing apparatus according to claim 1, wherein the producing unit updates the three-dimensional model data in response to an instruction from an outside while the object and the three-dimensional model are sterically displayed side by side.

3. The model producing apparatus according to claim 1, wherein the producing unit extracts an element satisfying a predetermined producing condition from the first and second elements included in the CAD data, and the producing unit produces the three-dimensional model data from the extracted element.

4. The model producing apparatus according to claim 3, wherein the predetermined producing condition includes a threshold relating to an area of the first element included in the CAD data, and the producing unit removes the first element having an area smaller than the threshold from a producing target of the three-dimensional model data among the first elements included in the CAD data.

5. The model producing apparatus according to claim 3, wherein the predetennined producing condition includes information indicating a specific geometric shape included in the CAD data, and the producing unit removes a portion corresponding to the specific geometric shape from a producing target of the three-dimensional model data.

6. The model producing apparatus according to claim 1, wherein each of the second elements defined by the CAD data includes information on a plane constituting the object, and the producing unit extracts a plane whose normal line intersects another plane in planes defined by the CAD data, the producing unit determines that the extracted plane is a portion that is not visually recognized from an outside of the object, and the producing unit removes the extracted plane from a producing target of the three-dimensional model data.

7. The model producing apparatus according to claim 1, wherein the display unit displays a recognition result obtained by performing the three-dimensional recognition using the produced three-dimensional model data while correlating the recognition result with the three-dimensional model, and the producing unit updates the three-dimensional model data according to an edit manipulation performed to the three-dimensional model, the three-dimensional model being displayed while correlated with the recognition result.

8. The model producing apparatus according to claim 1, further comprising a simulation unit for simulating a state in which the object defined by the CAD data is visually recognized according to an instructed imaging condition, wherein the display unit displays the state in which the object obtained by the simulation unit is visually recognized in parallel with the three-dimensional model defined by the three-dimensional model data.

9. A non-transitory computer-readable recording medium in which a model producing program is stored, wherein the model producing program produces three-dimensional model data based on CAD data, the three-dimensional model data being used in processing of performing three-dimensional recognition of an object, which acquires three-dimensional information from image data obtained by imaging the object with plural cameras and checks the acquired three-dimensional information against the three-dimensional model data to, the CAD data defining the object as a set of three-dimensional coordinate values of a plurality of points of the object, the model producing program causing a computer to perform the steps of:

receiving the CAD data in which a structure of the object is defined as a combination of first elements partitioned by a boundary line;

producing the three-dimensional model data by hierarchically defining boundary points of second elements, segments, and boundary lines between the second elements adjacent to each other, each of the second elements including one or a plurality of the first elements that are defined by the received CAD data, each of the segments being formed by joining the respective boundary points, each of the boundary lines between the second elements adjacent to each other being formed by the respective segments; and displaying sterically the object defined by the CAD data and a three-dimensional model defined by the produced three-dimensional model data side by side.

10. A model producing method for producing three-dimensional model data based on CAD data, wherein the three-dimensional model data is used in processing of performing three-dimensional recognition of an object, which acquires three-dimensional information from image data obtained by imaging the object with plural cameras and checks the acquired three-dimensional information against the three-dimensional model data to, the CAD data defining the object as a set of three-dimensional coordinate values of a plurality of points of the object, the model producing method comprising the steps of:

receiving the CAD data in which a structure of the object is defined as a combination of first elements partitioned by a boundary line;

producing the three-dimensional model data by hierarchically defining boundary points of second elements, segments, and boundary lines between the second elements adjacent to each other, each of the second elements including one or a plurality of the first elements that are defined by the received CAD data, each of the segments being formed by joining the respective boundary points, each of the boundary lines between the second elements adjacent to each other being formed by the respective segments; and displaying sterically the object defined by the CAD data and a three-dimensional model defined by the produced three-dimensional model data side by side.

11. The model producing apparatus according to claim 2, wherein the producing unit extracts an element satisfying a predetermined producing condition from the first and second elements included in the CAD data, and the producing unit produces the three-dimensional model data from the extracted element.

12. The model producing apparatus according to claim 2, wherein each of the second elements defined by the CAD data includes information on a plane constituting the object, and the producing unit extracts a plane whose normal line intersects another plane in planes defined by the CAD data, the producing unit determines that the extracted plane is a portion that is not visually recognized from an outside of the object, and the producing unit removes the extracted plane from a producing target of the three-dimensional model data.

\* \* \* \* \*